(12) United States Patent
Gardner et al.

(10) Patent No.: US 11,264,285 B2
(45) Date of Patent: Mar. 1, 2022

(54) METHOD FOR FORMING FILM STACKS WITH MULTIPLE PLANES OF TRANSISTORS HAVING DIFFERENT TRANSISTOR ARCHITECTURES

(71) Applicant: TOKYO ELECTRON LIMITED, Tokyo (JP)

(72) Inventors: Mark Gardner, Cedar Creek, TX (US); Jim Fulford, Marianna, FL (US)

(73) Assignee: TOKYO ELECTRON LIMITED, Tokyo (JP)

( * ) Notice: Subject to any disclaimer, the term of this patent is extended or adjusted under 35 U.S.C. 154(b) by 220 days.

(21) Appl. No.: 16/665,599

(22) Filed: Oct. 28, 2019

(65) Prior Publication Data

US 2021/0013107 A1    Jan. 14, 2021

Related U.S. Application Data

(60) Provisional application No. 62/871,242, filed on Jul. 8, 2019.

(51) Int. Cl.
*H01L 21/3205* (2006.01)
*H01L 21/02* (2006.01)
(Continued)

(52) U.S. Cl.
CPC .............. *H01L 21/823807* (2013.01); *H01L 21/02532* (2013.01); *H01L 21/02538* (2013.01);
(Continued)

(58) Field of Classification Search
CPC .................. H01L 21/823807; H01L 27/0922
(Continued)

(56) References Cited

U.S. PATENT DOCUMENTS 9,660,033 B1  5/2017  Chen et al.
9,721,846 B1  8/2017  Xiao
(Continued)

FOREIGN PATENT DOCUMENTS

KR   10-2018-0020077 A   2/2018

OTHER PUBLICATIONS

International Search Report and Written Opinion dated Oct. 5, 2020 in PCT/US2020/038043, citing documents AS, and AA through AD therein. 9 pages

*Primary Examiner* — Calvin Lee
(74) *Attorney, Agent, or Firm* — Oblon, McClelland, Maier & Neustadt, L.L.P.

(57) ABSTRACT

Three-dimensional integration can overcome scaling limitations by increasing transistor density in volume rather than area. To provided gate-all-around field-effect-transistor devices with different threshold voltages and doping types on the same substrate, methods are provided for growing adjacent nanosheet stacks having channels with different doping profiles. In one example, a first nanosheet stack is formed having channels with first doping characteristics. Then the first nanosheet stack is etched, and a second nanosheet stack is formed in plane with the first nanosheet stack. The second nanosheet stack has channels with different doping characteristics. This process can be repeated for additional nanosheet stacks. In another example, the formation of the nanosheet stacks with channels having different doping characteristics is performed by restricting layer formation to predefined locations using a patterned layer (e.g., a conformal oxide layer) that limits epitaxial growth to exposed regions of the substrate where the patterned layer is etched away.

18 Claims, 28 Drawing Sheets

(51) Int. Cl.
*H01L 21/8238* (2006.01)
*H01L 29/06* (2006.01)
*H01L 29/423* (2006.01)
*H01L 29/786* (2006.01)
*H01L 21/306* (2006.01)
*H01L 21/308* (2006.01)
*H01L 29/66* (2006.01)
*H01L 27/092* (2006.01)

(52) U.S. Cl.
CPC ...... *H01L 21/02603* (2013.01); *H01L 21/308* (2013.01); *H01L 21/30604* (2013.01); *H01L 21/823814* (2013.01); *H01L 27/0922* (2013.01); *H01L 29/0673* (2013.01); *H01L 29/42392* (2013.01); *H01L 29/66439* (2013.01); *H01L 29/66522* (2013.01); *H01L 29/66742* (2013.01); *H01L 29/78618* (2013.01); *H01L 29/78651* (2013.01); *H01L 29/78681* (2013.01); *H01L 29/78696* (2013.01)

(58) Field of Classification Search
USPC .................................. 257/200, 201; 438/606
See application file for complete search history.

(56) References Cited

U.S. PATENT DOCUMENTS

| | | | |
|---|---|---|---|
| 9,899,264 B2 | 2/2018 | Bao et al. | |
| 9,941,282 B2 | 4/2018 | Bao et al. | |
| 9,997,519 B1* | 6/2018 | Bao | H01L 29/4966 |
| 10,026,652 B2 | 7/2018 | Wang et al. | |
| 10,134,843 B2 | 11/2018 | Chen et al. | |
| 10,243,054 B1* | 3/2019 | Cheng | H01L 27/088 |
| 10,332,883 B2 | 6/2019 | Bao et al. | |
| 10,332,961 B2* | 6/2019 | Cheng | H01L 29/0847 |
| 10,410,933 B2 | 9/2019 | Xie et al. | |
| 10,522,625 B2 | 12/2019 | Chen et al. | |
| 10,658,493 B2* | 5/2020 | Bi | H01L 29/0649 |
| 10,700,064 B1* | 6/2020 | Zhang | H01L 29/4966 |
| 10,957,798 B2* | 3/2021 | Miao | H01L 29/78696 |
| 2017/0256615 A1 | 9/2017 | Chen et al. | |
| 2017/0271211 A1 | 9/2017 | Xiao | |
| 2018/0005891 A1 | 1/2018 | Bao et al. | |
| 2018/0006033 A1 | 1/2018 | Bao et al. | |
| 2018/0053690 A1 | 2/2018 | Wang et al. | |
| 2018/0090381 A1 | 3/2018 | Bao et al. | |
| 2018/0342427 A1 | 11/2018 | Xie et al. | |
| 2019/0088743 A1 | 3/2019 | Chen et al. | |
| 2020/0083221 A1* | 3/2020 | Ando | H01L 29/66439 |
| 2020/0135862 A1 | 4/2020 | Chen et al. | |

* cited by examiner

110

10

10

METHOD FOR FORMING FILM STACKS WITH MULTIPLE PLANES OF TRANSISTORS HAVING DIFFERENT TRANSISTOR ARCHITECTURES

FIELD

This disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

Three-dimensional (3D) integration (i.e., the vertical stacking of multiple devices) can be used to overcome scaling limitations arising in planar devices. Scaling limitations are overcome in 3D integration by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

SUMMARY

According to aspects of one embodiment, there is provided a method of microfabrication. The method includes steps of (i) forming a first nanosheet stack on a substrate, the first nanosheet stack having first layers of material including a semiconducting material, at least two of the first layers of being first channels of gate-all-around (GAA) field-effect transistor (FET) devices, the first channels comprising a first channel material having a first doping profile; (ii) selectively masking a portion of the first nanosheet stack; (iii) etching unmasked portions of the first nanosheet stack down to a predetermined depth; and (iv) growing a second nanosheet stack on the substrate in regions of the substrate that have been etched, the second nanosheet stack being in plane with the first nanosheet stack, the second nanosheet stack having second layers of material including the semiconducting material, at least two of the second layers of material being second channels of GAA FET devices, the second channels comprising a second channel material having a second doping profile, the second doping profile causing the GAA FET devices of the second channels to have a different threshold voltage than the GAA FET devices of the first channels.

According to aspects of another embodiment, there is provided a method of microfabrication. The method includes steps of (i) forming a first mask on a substrate that defines a first region on the substrate, the first region being not covered by the first mask; (ii) forming, in the first region, a first nanosheet stack on a substrate, the first nanosheet stack having first layers of material including a semiconducting material, at least two of the first layers being first channels of gate-all-around (GAA) field-effect transistor (FET) devices, the first channels comprising a first channel material having a first doping profile; (iii) forming a second mask on a substrate that defines a second region on the substrate, the second mask covering the first nanosheet stack, and the second region being not covered by the second mask; and (iv) forming a second nanosheet stack on the substrate in the second region, the second nanosheet stack being in plane with the first nanosheet stack, the second nanosheet stack having multiple layers of material including the semiconducting material, at least two of the layers being second channels of GAA FET devices, the second channels comprising a second channel material having a second doping profile, the second doping profile causing the GAA FET devices of the second channels to have having a different threshold voltage than the GAA FET devices of the first channels.

Threshold voltage (Vt) is the minimum voltage to activate a transistor within a CMOS (complementary metal-oxide-semiconductor) device. As CMOS devices have been scaling, there has been an increase in the number of different threshold voltages used within a given design. Using different threshold voltages enables designers to optimize specific portions of a chip to operate at higher performance or with lower power as needed. Conventional devices manufactured in conventional Foundry N5 technology nodes can incorporate greater than 5 different threshold voltages, which places significant complexity within the chip manufacturing process.

Techniques herein include architectures and method for making a collection of transistor types on multiple transistor planes. Many transistor circuit designs require both HV (high voltage transistors) and LV (low voltage transistors) to integrate all the CMOS (complementary metal oxide semiconductor) logic circuits and elements. Typically HV transistors require higher Vds, higher Vg, and thus higher Vt (threshold voltage), and thicker gate oxide thickness relative. Additionally HV devices demand higher power requirements relative to the LV devices. Circuits made with techniques herein can provide multiple different Vt devices for both LV and HV devices for NMOS and PMOS, with multiple different gate oxide thickness values to enable multiple transistor planes for 3D devices.

One embodiment includes forming a first nanosheet stack on a substrate. The first nanosheet stack has multiple layers of material including semiconducting material. At least two of the layers of material are channel material for gate-all-around field-effect transistor devices. The first nanosheet stack is formed with channel material layers having a first doping profile. Selectively masking a portion of the first nanosheet stack. Etching uncovered portions of the first nanosheet stack down to predetermined location. Growing a second nanosheet stack on the substrate in unmasked regions of the substrate. The second nanosheet stack being in plane with the first nanosheet stack. The second nanosheet stack having multiple layers of material including semiconducting material, at least two of the layers of material being channel material for a gate-all-around field-effect transistor devices. The second nanosheet stack formed with channel material layers having a second doping profile. The second doping profile resulting in channel material from the second nanosheet stack having a different threshold voltage as compared to channel material from the first nanosheet stack.

Another embodiment includes selectively growing nanosheet stack at uncovered locations on a substrate, each nanosheet stack or set of nanosheet stacks can have a doping profile different from adjacent nanosheet stacks.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1A:
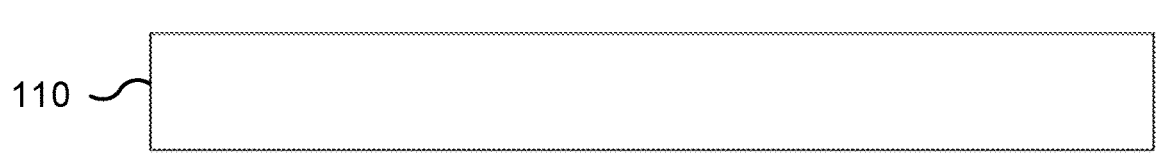
FIG. 1A shows a cross-section through a channel region of a field effect transitory (FET) device at a first point during a first fabrication method, according one implementation.

Embodiments herein include devices and techniques to fabricate transistors with multiple threshold voltages at various locations across the substrate. This enables chip designs with gate-all-around (GAA) transistors having different threshold voltages at different coordinate locations in both the horizontal direction and the vertical direction. That is, GAA transistors herein can be either low voltage devices or high voltage devices in the x-y plane or the z plane. One embodiment include growing a first nanosheet stack, removing a portion and then growing (regrowing) a second nanosheet stack that has a different doping profile. Subsequent nanosheet stacks can also be grown with different doping profiles.

Referring now to the drawings, wherein like reference numerals designate identical or corresponding parts throughout the several views, FIGS. 1A-1L, and 2 illustrate a first method of fabricating GAA transistor devices having different channel characteristics. In particular, FIGS. 1A-1L, show a cross-section through a channel region of the GAA transistor devices. For different nanosheet stacks the channels can have different doping types, different doping concentrations, different doping profiles, different gate insulator thickness, and/or different dimensions (e.g., different widths, lengths, and/or heights). Thus, respective transistor on the same substrate can be tailored to different uses. For example, transistors at the same height in adjacent nanosheet stacks can be NMOS and PMOS, respectively. Or one transistor can be a low-current transistor and the adjacent transistor can be a high-current transistor. For example, a six transistor (6T) SRAM memory uses two PMOS transistors and four NMOS transistors. Further, the carrier mobility depends on whether the charge carriers are electrons or holes. Thus, the channel characteristics can be modified based on the type of charge carriers for a given transistor. Further, the gate insulator (e.g., gate oxide) thickness can also be adjusted to achieve the desired transistor performance.

The methods described herein enable the formation of channels with different characteristics not only in the vertical direction (i.e., the direction in which successive layers are grown to form a nanosheet stack), but also in the lateral direction, by forming successive stacks using different growth and doping parameters.

Figure 4:
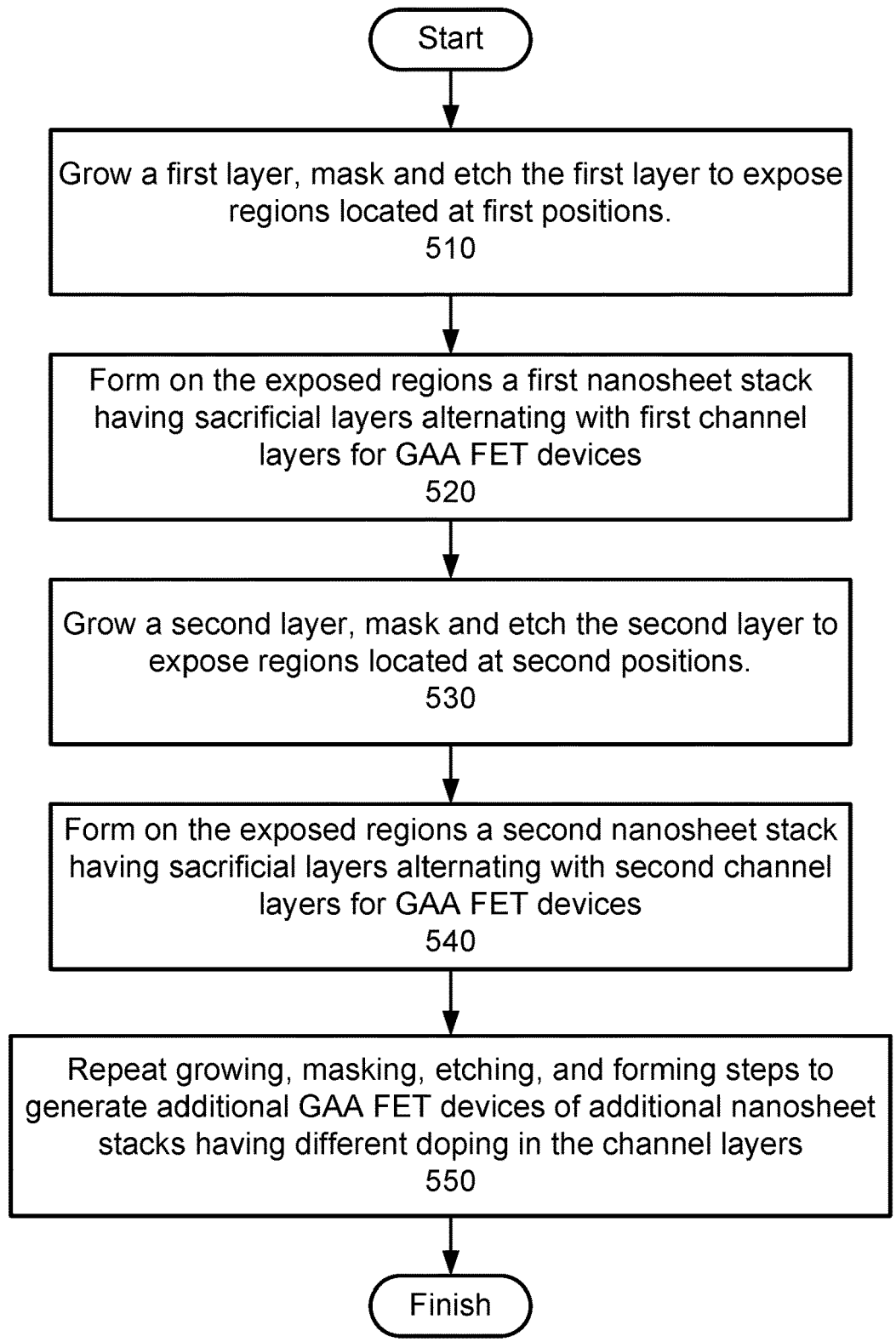
FIG. 4 shows a flow diagram of the second fabrication method for fabricating the FET device, according one implementation.

FIG. 1A shows that a substrate 110 is provided as a starting point for method 400, which is shown FIG. 4. nanosheet stack. The material of the substrate 110 can be a bulk silicon wafer, bulk germanium wafer, SOI (silicon on insulator) wafer or other substrate.

In step 410, various layers of a first nanosheet stack are formed on the substrate 110. First, an etch stop layer 112 is grown, deposited, or otherwise formed on the substrate 110. In one non-limiting example, SiGe3 or Ge is used as the etch stop layer 112. Here, the terms "SiGe," "SiGe2," and "SiGe3" refer to various silicon-germanium compounds, wherein the compound allow has a molar ratio of $Si_xGe_{1-x}$ in which x is greater than zero and less than one. The designation of "SiGe2" and "SiGe3" is used to uniquely identify the silicon-germanium compounds in different layers. For example, the value of x can be different for each of SiGe, SiGe2, and SiGe3.

Figure 1B:
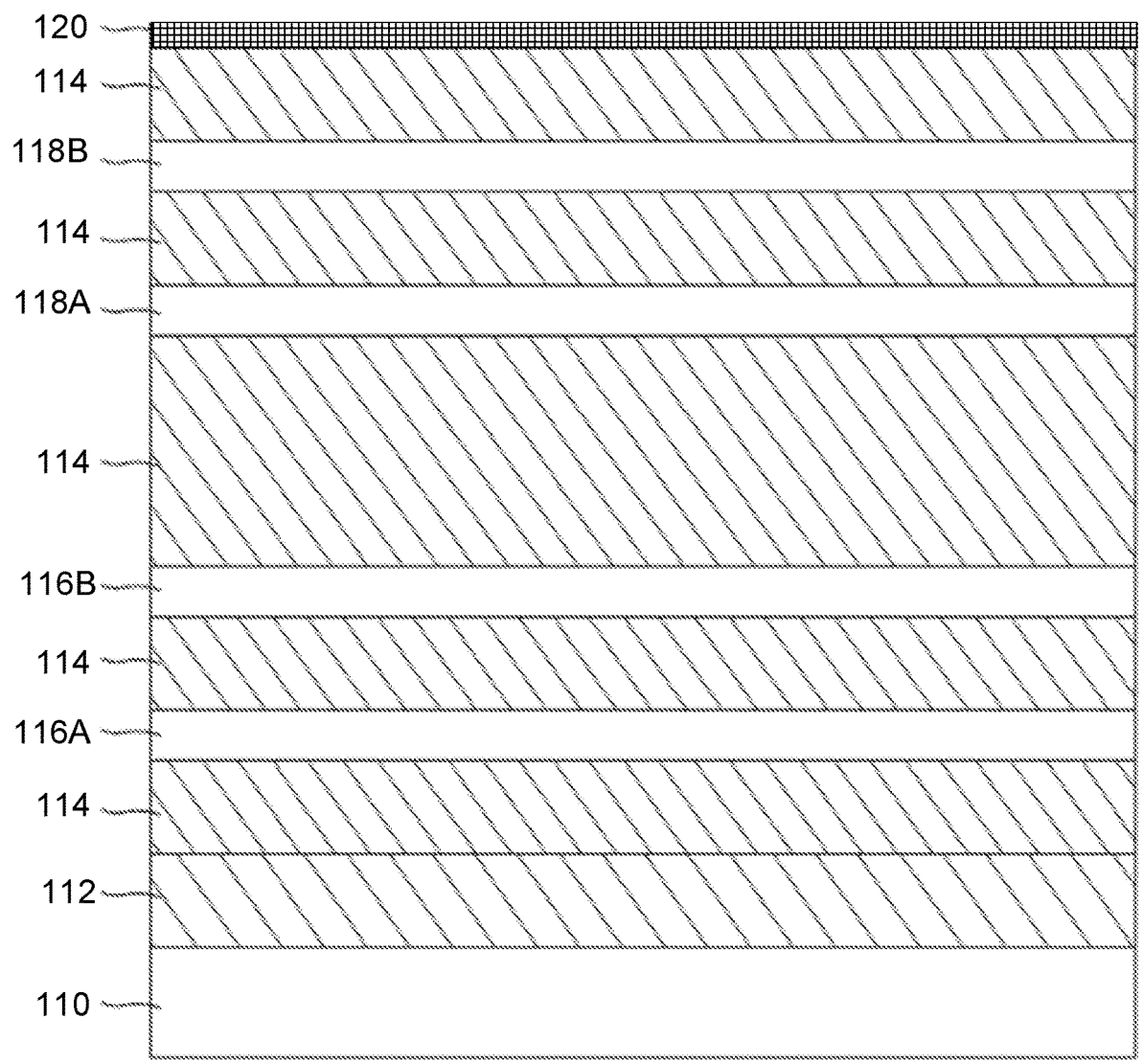
FIG. 1B shows a cross-section through the FET device at a second point during the first fabrication method, according one implementation.

After forming the etch stop layer 112, multiple layers or thin films are then epitaxially grown, as shown in FIG. 1B. These layers include sacrificial layers 114 (e.g., SiGe2) alternating respectively with first channel layers 116A and 116B and second channel layers 118A and 118B, with a cap layer 120 on the top of the first nanosheet stack. The cap layer 120 is often an oxide cap layer, and in certain implementations can be a silicon dioxide cap layer. Accordingly, the cap layer 120 can be referred to in the alternative as the oxide cap layer 120, the oxide layer 120, or as the silicon dioxide cap layer 120, in certain implementations. In some implementations the topmost sacrificial layer 114 can be Ge, rather than SiGe2. In some embodiments, the sacrificial layers 114 can be $Si_xGe_{1-x}$ in which x can range with 0.6 to 0.8. Additionally, other materials that may be used for substrates and for sacrificial layers 114 including, e.g., Ge, C, SiGe, SiC, GeC, GaAs, InAs, InP, and GeSn.

The first channel layers 116A and 116B and the second channel layers 118A and 118B can be grown for use as channel material for a GAA transistor device. In certain embodiments, the channel layers are silicon layers. Alternatively, the channel layers can be compound semiconductors, such as a III-V semiconductor (e.g., gallium arsenide GaAs, gallium nitride GaN, etc.). Here, the non-limiting example of the channel layers being silicon layers is used to illustrate the methods described herein. Each silicon layer can be doped as it is grown, or doped after it is grown and before growing the next layer (e.g., using ion implantation or diffusion) to achieve a desired doping profile. Accordingly, different dopants and/or different dopant amounts can be applied to each silicon layer. After a given nanosheet stack is grown, a cap layer 120 can be deposited.

Figure 1C:
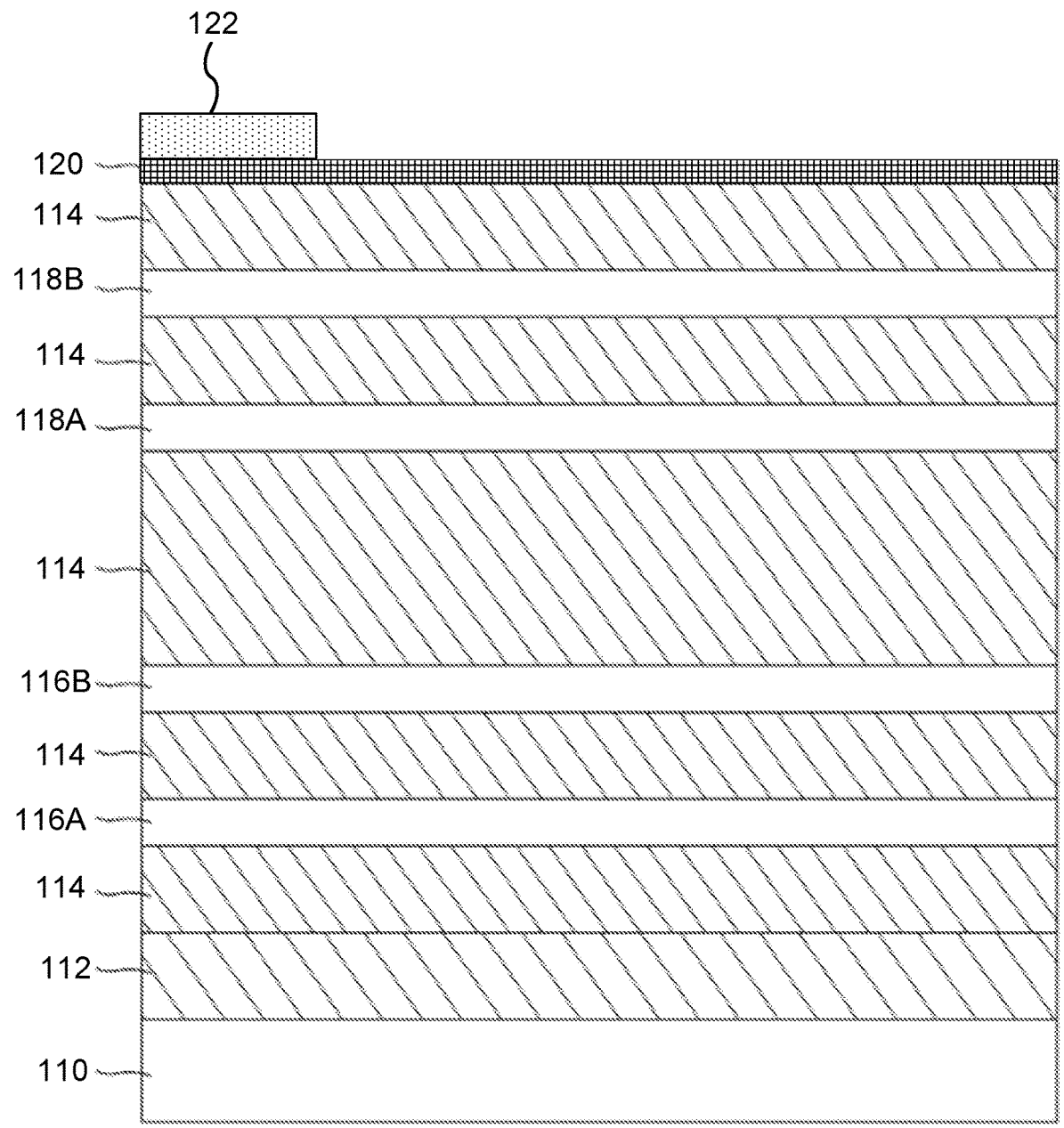
FIG. 1C shows a cross-section through the FET device at a third point during the first fabrication method, according one implementation.

In step 420, a portion of this nanosheet stack is then selectively masked, such as with a photoresist etch mask 122. The etch mask 122 can be formed using self-aligned multi-patterning, as shown in FIG. 1C. The mask 122 prevents the masked reason from being etched and removed while allowing removal of the layers of the nanosheet stack to be removed in exposed regions. With selected regions for the first nanosheet stack covered, the uncovered portions of the nanosheet stack are etched anisotropically to remove the layer stack. This can be etched down to and stop at the etch stop layer 112 or can be etched through the etch stop layer 112. The etch mask 122 can then be removed.

Figure 1D:
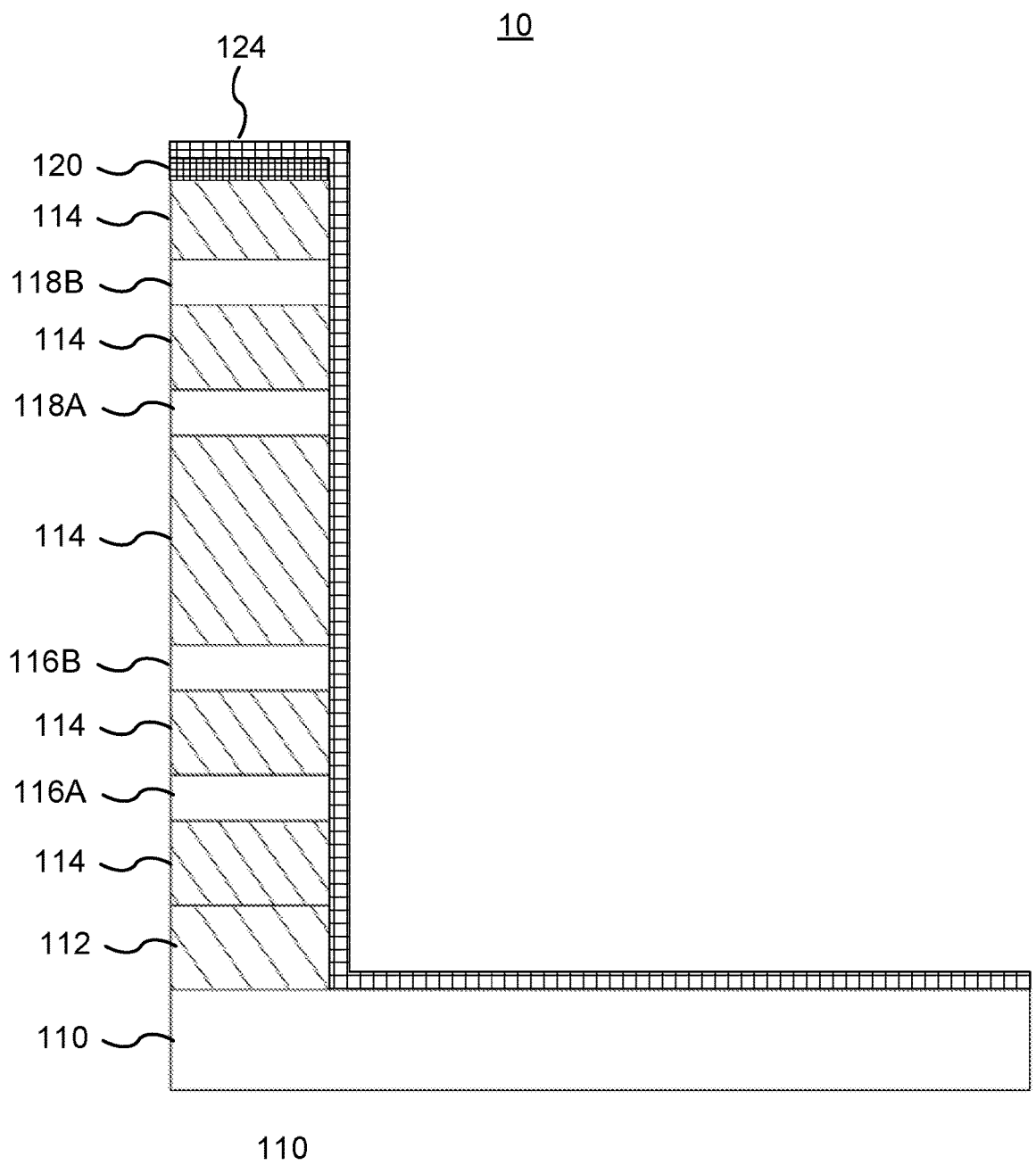
FIG. 1D shows a cross-section through the FET device at a fourth point during the first fabrication method, according one implementation.

FIG. 1D shows a cross-section of the transistors device 10 after the etch and after a protective film 124 has been either deposited or grown. The film 124 can a conformal oxide film that is masked and then etched to leave behind a residual conformal film that protects completed nanosheet stacks while subsequent stack are being formed. Accordingly, in certain implementations, the film 124 is referred to a conformal oxide film 124, a conformal oxide layer 124. After masking and etching of the film 124 is complete, the film 124 can be referred or as a residual oxide layer 124.

After removing some of the first nanosheet stack, the first nanosheet stack 100 and the exposed portion of the substrate 110 is coated with the protective film 124, such as silicon dioxide deposited via chemical vapor deposition (CVD).

Figure 1E:
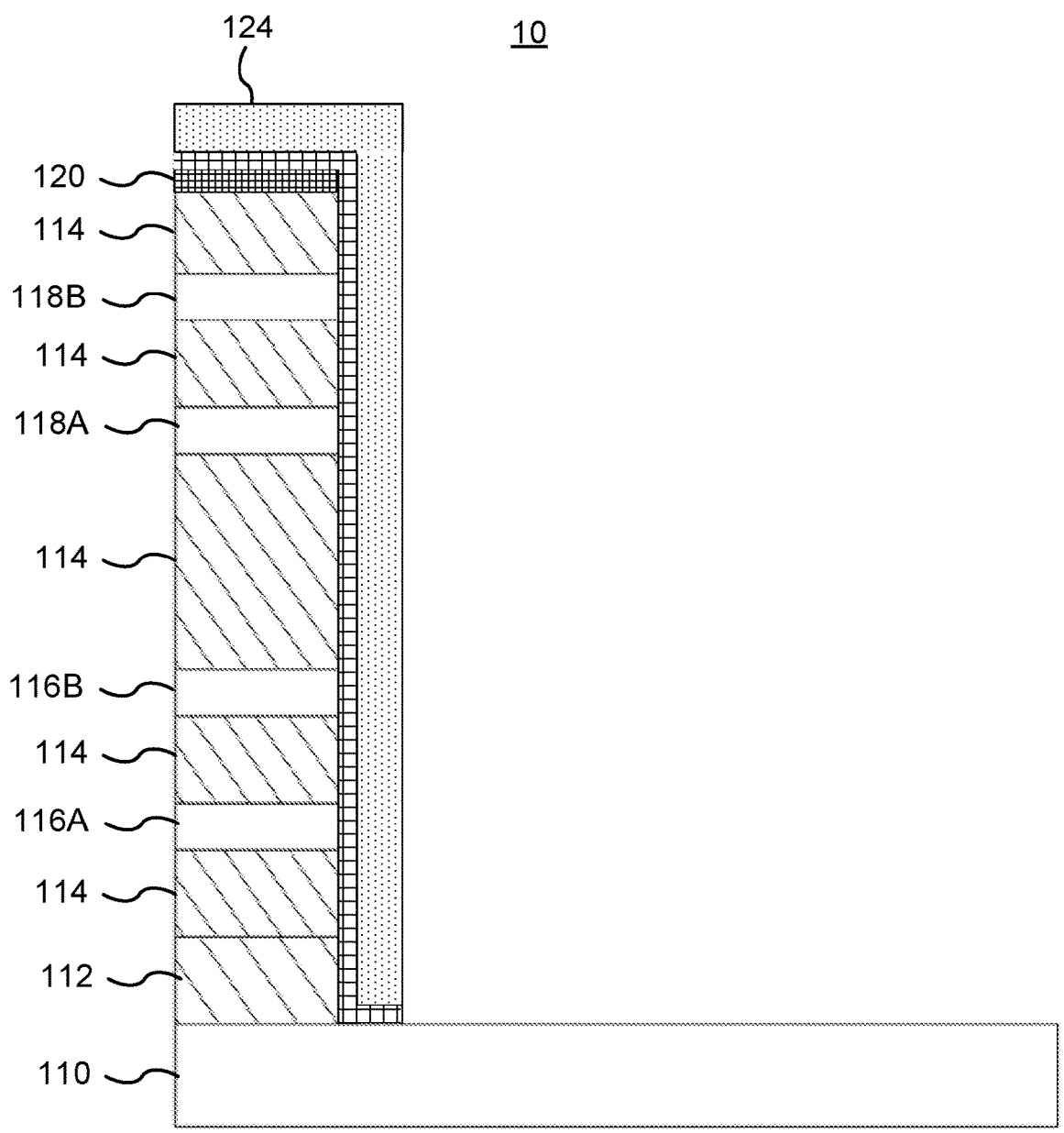
FIG. 1E shows a cross-section through the FET device at a fifth point during the first fabrication method, according one implementation.

FIG. 1E shows that the remaining portion of the first nanosheet stack 100 is then masked to prevent epitaxial growth on the first nanosheet stack 100 while the second nanosheet stack 200 is being formed. The conformal oxide film 124 can be removed for growing silicon films on the bulk substrate 110.

In step 430, the various layers of the second nanosheet stack 200 are formed on the substrate 110. First, an etch stop layer 212 is grown, deposited, or otherwise formed on the substrate 110. In one non-limiting example, SiGe3 or Ge is used as the etch stop layer 112.

Figure 1F:
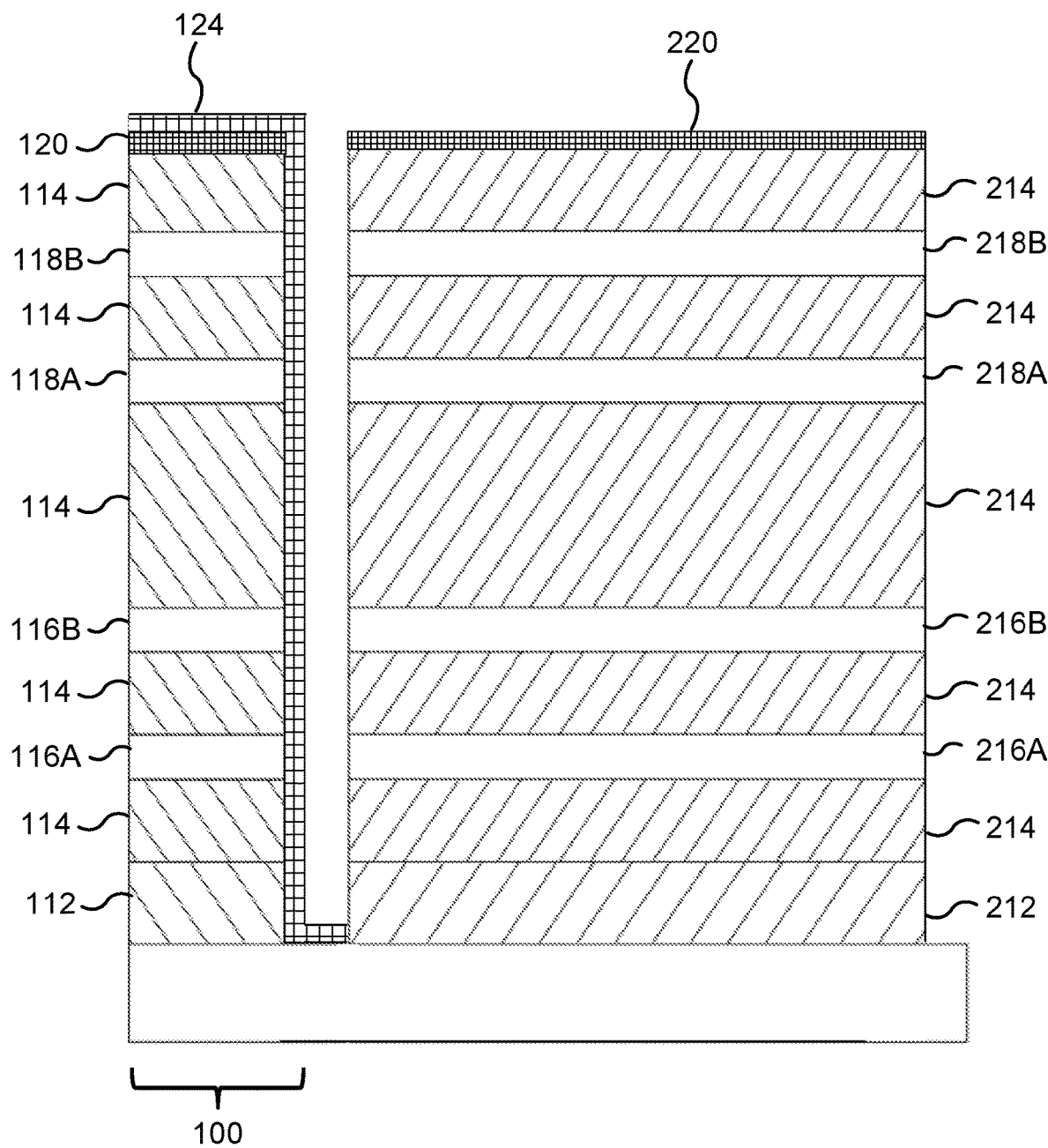
FIG. 1F shows a cross-section through the FET device at a sixth point during the first fabrication method, according one implementation.

After forming the etch stop layer 212, multiple layers or thin films are then epitaxially grown, as shown in FIG. 1F. These layers include sacrificial layers 214 (e.g., SiGe2) alternating respectively with first channel layers 216A and 216B and second channel layers 218A and 218B, with an oxide cap layer 220 on the top of the second nanosheet stack 200. In certain implementations, the sacrificial layers 214 can be the same material as used for the sacrificial layers 114.

The first channel layers 216A and 216B can be a same material as the first channel layers 116A and 116B, except the doping can be different. For example, the first channel layers 216A and 216B can be silicon doped with phosphorus atoms (i.e., n-type doping), and the first channel layers 116A and 116B can be silicon doped with boron atoms (i.e., p-type doping). In another implementation, the first channel layers 216A and 216B can have a same type of doping as the first channel layers 116A and 116B, except the doping concentration or the channel geometry can be different.

The second channel layers 218A and 218B can be a same material as the second channel layers 118A and 118B, except the doping can be different. For example, the second channel layers 218A and 218B can be silicon doped with phosphorus atoms (i.e., n-type doping), and the second channel layers 118A and 118B can be silicon doped with boron atoms (i.e., p-type doping). In another implementation, second channel layers 218A and 218B can have a same type of doping as the second channel layers 118A and 118B, except the doping concentration or the channel geometry can be different.

In one implementation, the first channel layers 216A and 216B can be tied together, having a common drain and a common source to form a single transistor. This way, the transistor can have two channels in order to handle twice as much current as a single channel transistor. In another implementation, each first channel layer 216A and 216B can correspond to a respective transistor. The other pairs of channel layers denote by "A" and "B" respectively can also be configured as either a combination to form a single transistor with two channels, or can also be configured separately to form two separate single channel transistors.

In some implementations the topmost sacrificial layer 214 can be Ge, rather than SiGe2. In some embodiments, the sacrificial layers 214 can be $Si_xGe_{1-x}$ in which x can range with 0.6 to 0.8. Additionally, other materials that may be used for substrates and for sacrificial layers 114 including, e.g., Ge, C, SiGe, SiC, GeC, GaAs, InAs, InP, and GeSn.

The first channel layers 216A and 216B and the second channel layers 218A and 218B can be grown for use as channel material for a GAA transistor device. In certain embodiments, the channel layers are silicon layers. Each silicon layer can be doped as it is grown, or doped after it is grown and before growing the next layer (e.g., using ion implantation or diffusion) to achieve a desired doping profile. Accordingly, different dopants and/or different dopant amounts can be applied to each silicon layer. After a given nanosheet stack is grown, a silicon dioxide cap 220 can be deposited.

Figure 1G:
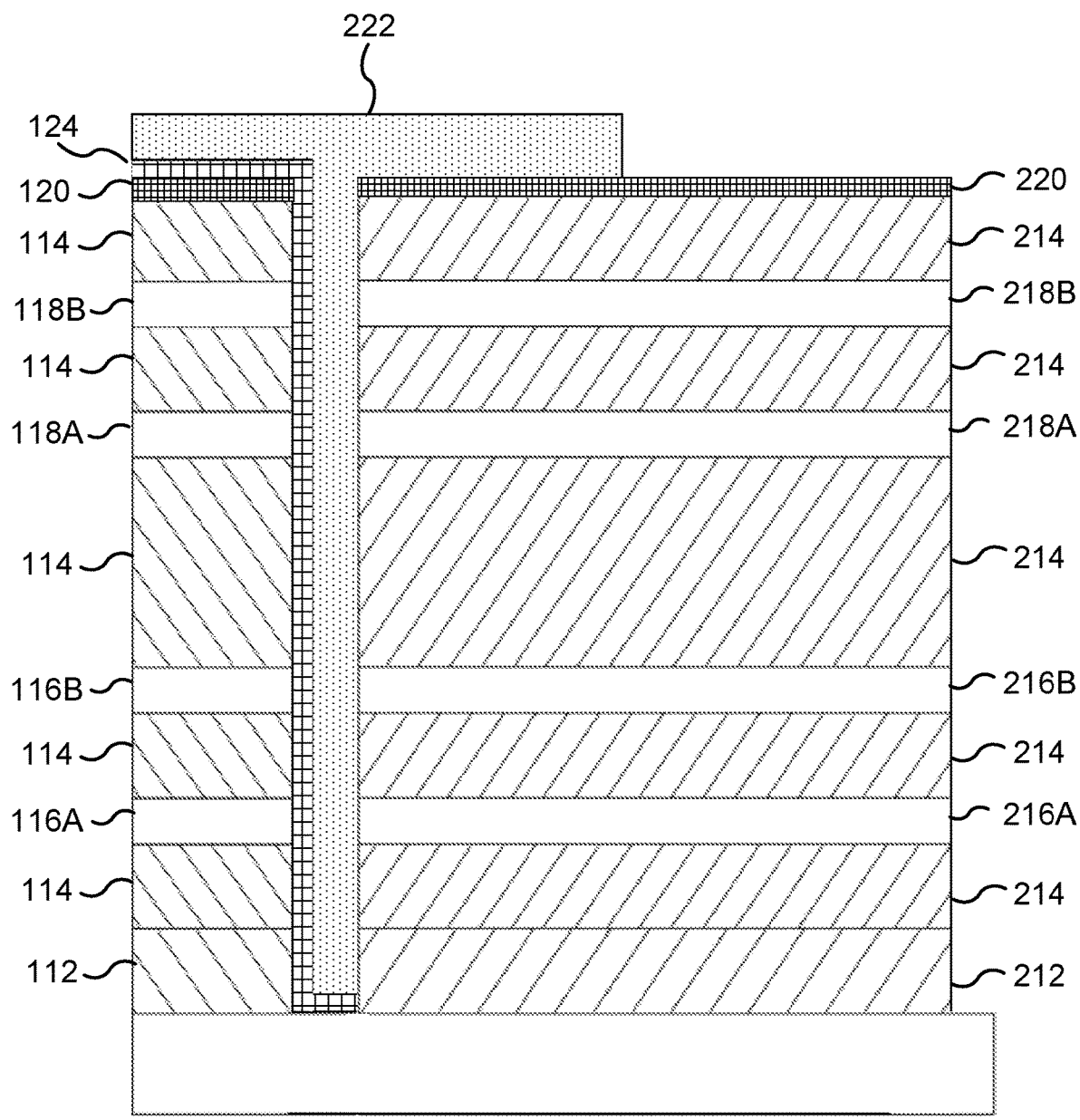
FIG. 1G shows a cross-section through the FET device at a seventh point during the first fabrication method, according one implementation.

In step 440, a portion of the second nanosheet stack is selectively masked, such as with a photoresist etch mask 222, with the rest of the second nanosheet stack exposed to be etched. The etch mask can be formed using self-aligned multi-patterning, as shown in FIG. 1G. The mask 222 prevents the masked reason from being etched and removed while allowing removal of the layers of the second nanosheet stack to be removed in exposed regions. With selected regions for the second nanosheet stack covered, the uncovered portions of the nanosheet stack are etched anisotropically to remove the layer stack. This can be etched down to and stop at the etch stop layer 212 or can be etched through the etch stop layer 212. The etch mask 222 can then be removed.

Figure 1H:
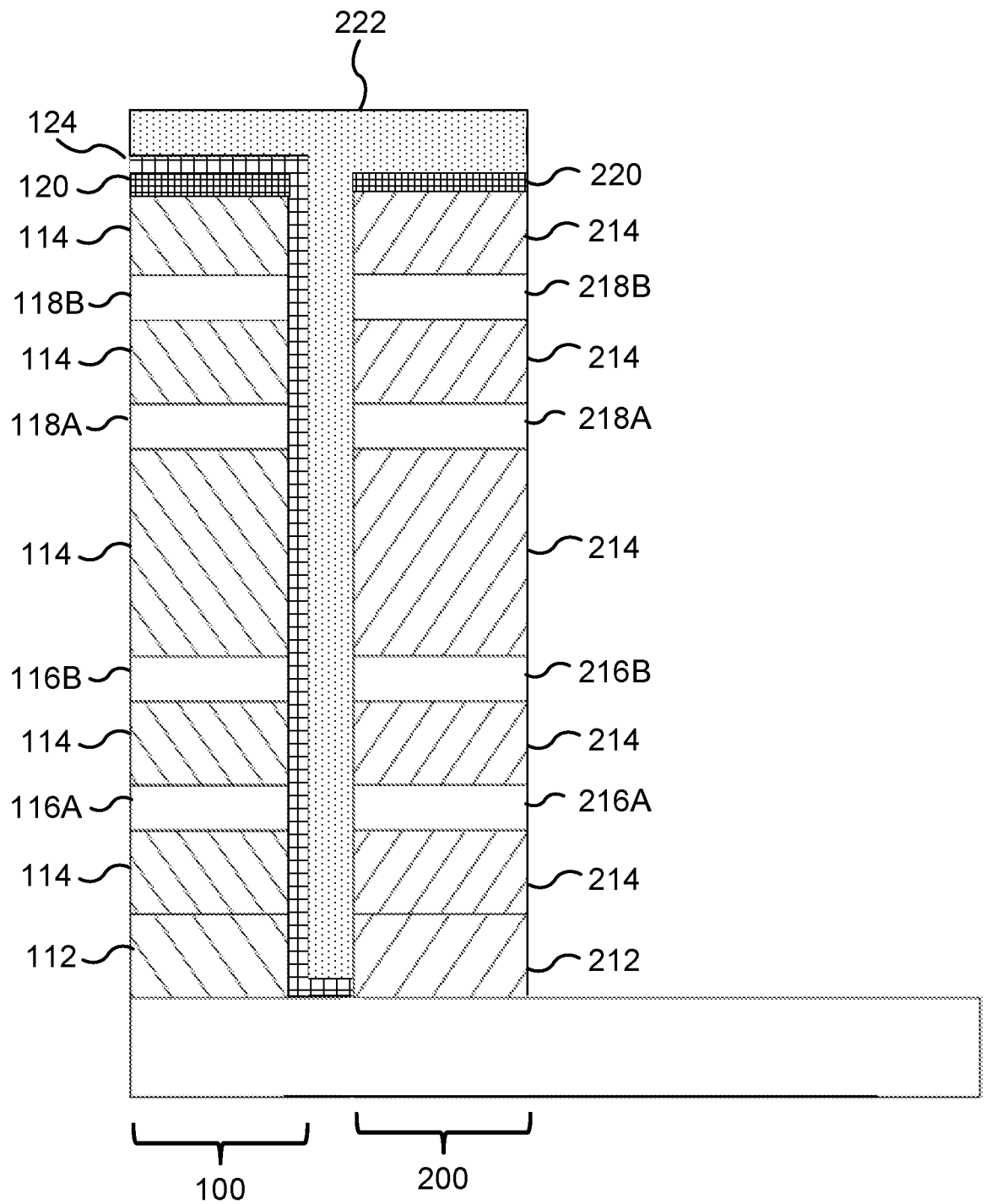
FIG. 1H shows a cross-section through the FET device at an eighth point during the first fabrication method, according one implementation.
Figure 1I:
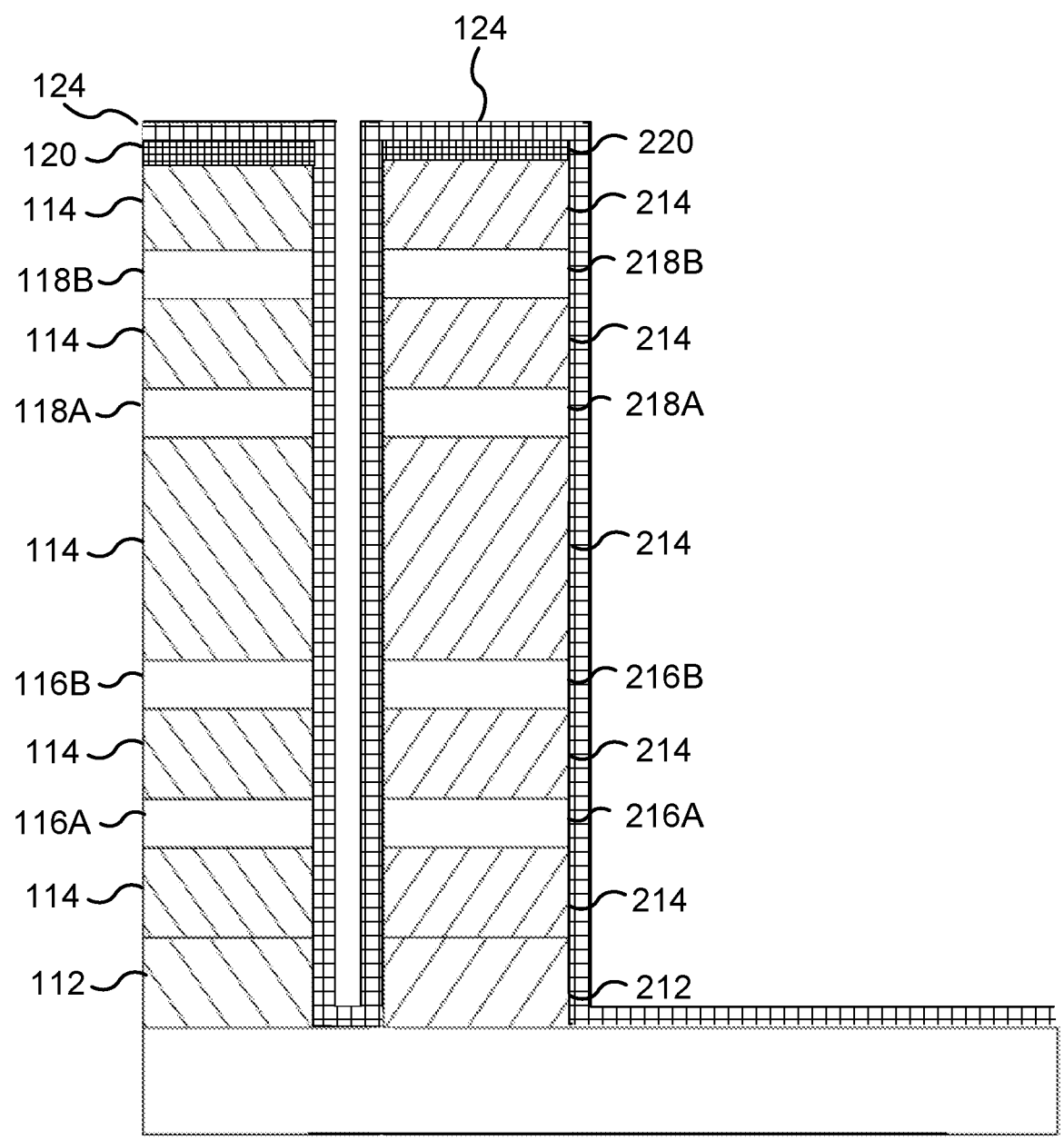
FIG. 1I shows a cross-section through the FET device at a ninth point during the first fabrication method, according one implementation.

FIG. 1H shows a cross-section of the transistors device 10 after the etch, and FIG. 1I after a protective film 124 has been either deposited or grown over the second nanosheet stack. After removing some of the second nanosheet stack, the second nanosheet stack and the exposed portion of the substrate 110 is coated with the protective film 124, such as silicon dioxide deposited via chemical vapor deposition (CVD).

Figure 1J:
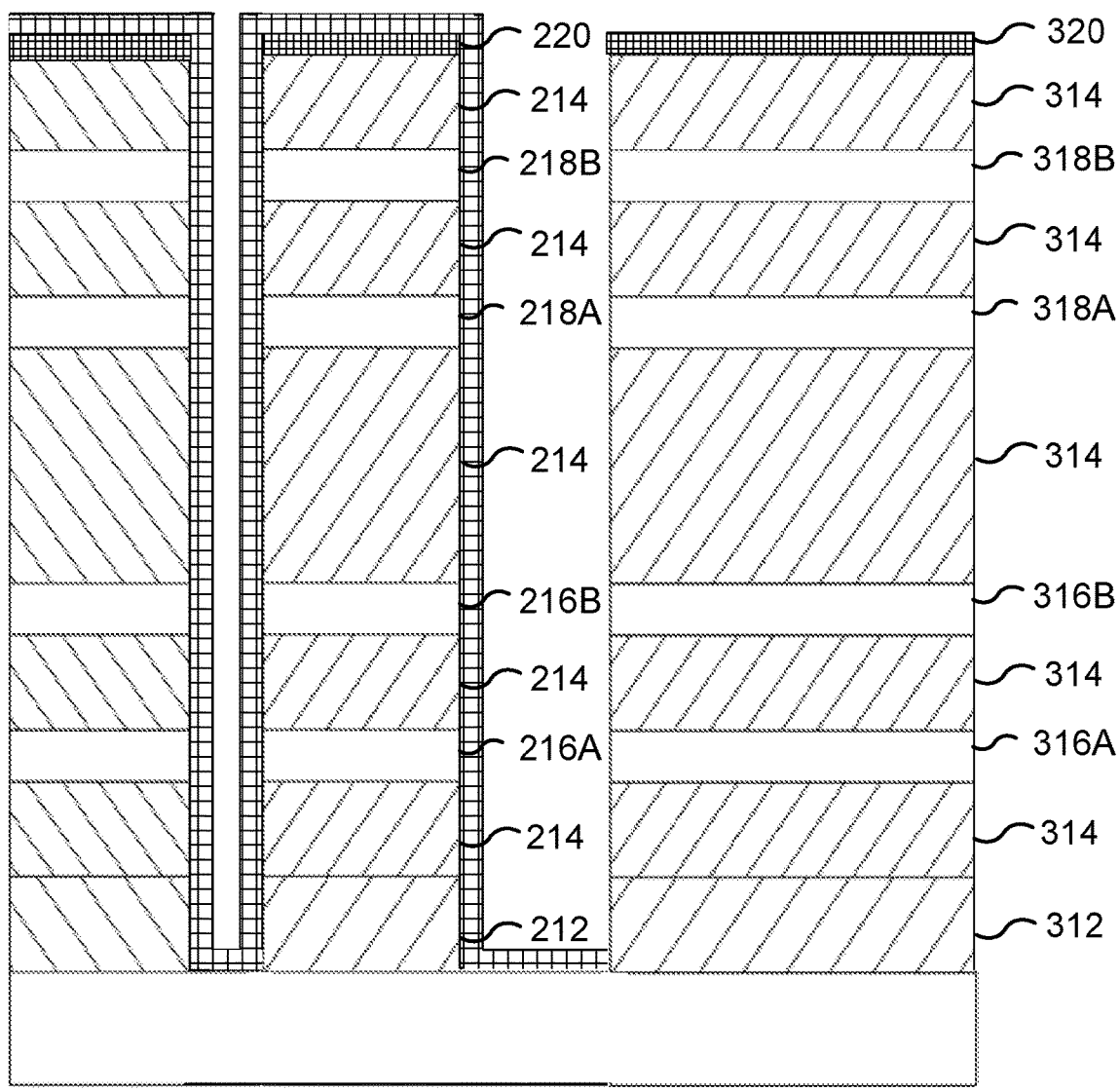
FIG. 1J shows a cross-section through the FET device at a tenth point during the first fabrication method, according one implementation.
Figure 1K:
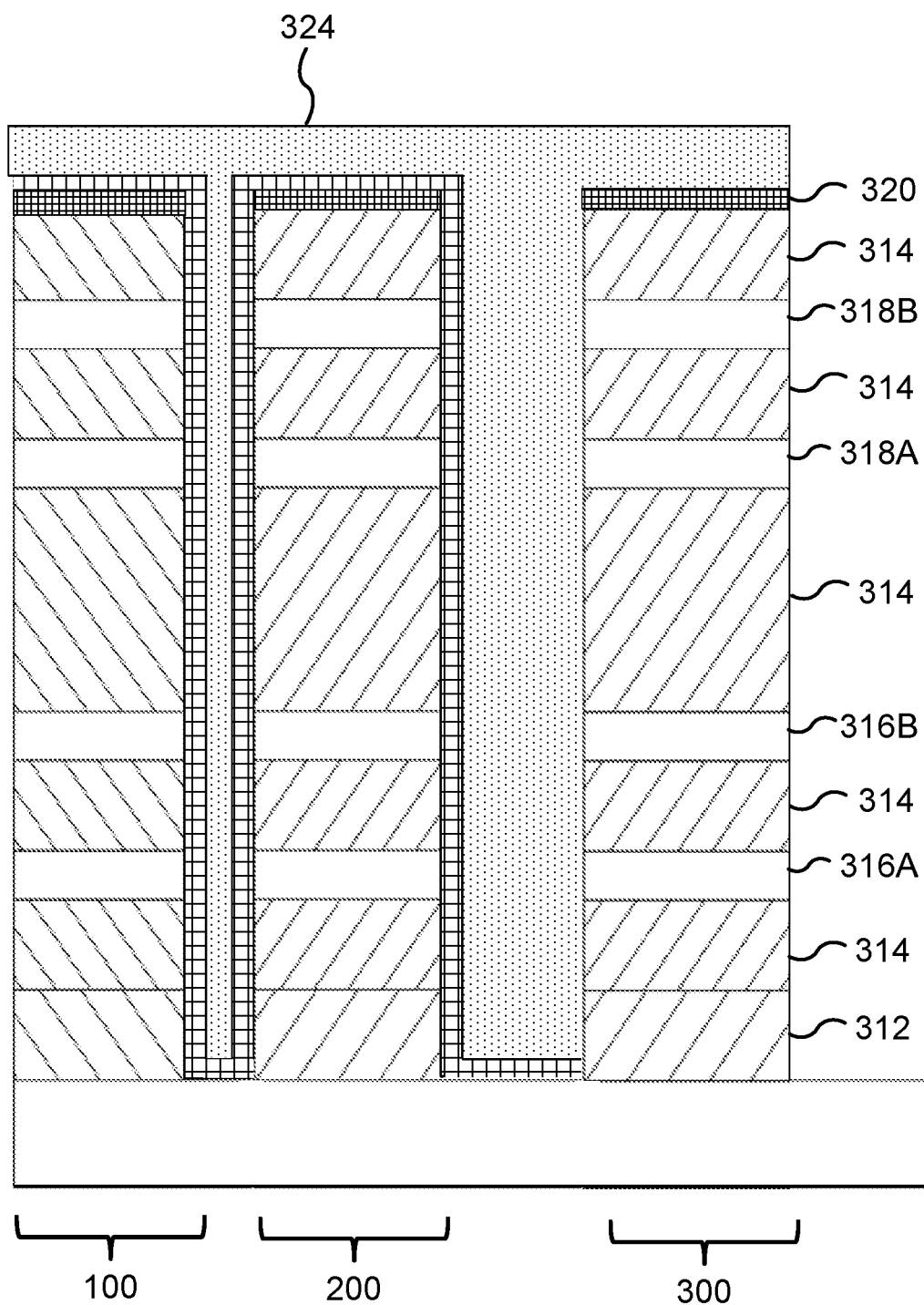
FIG. 1K shows a cross-section through the FET device at a eleventh point during the first fabrication method, according one implementation.
Figure 1L:
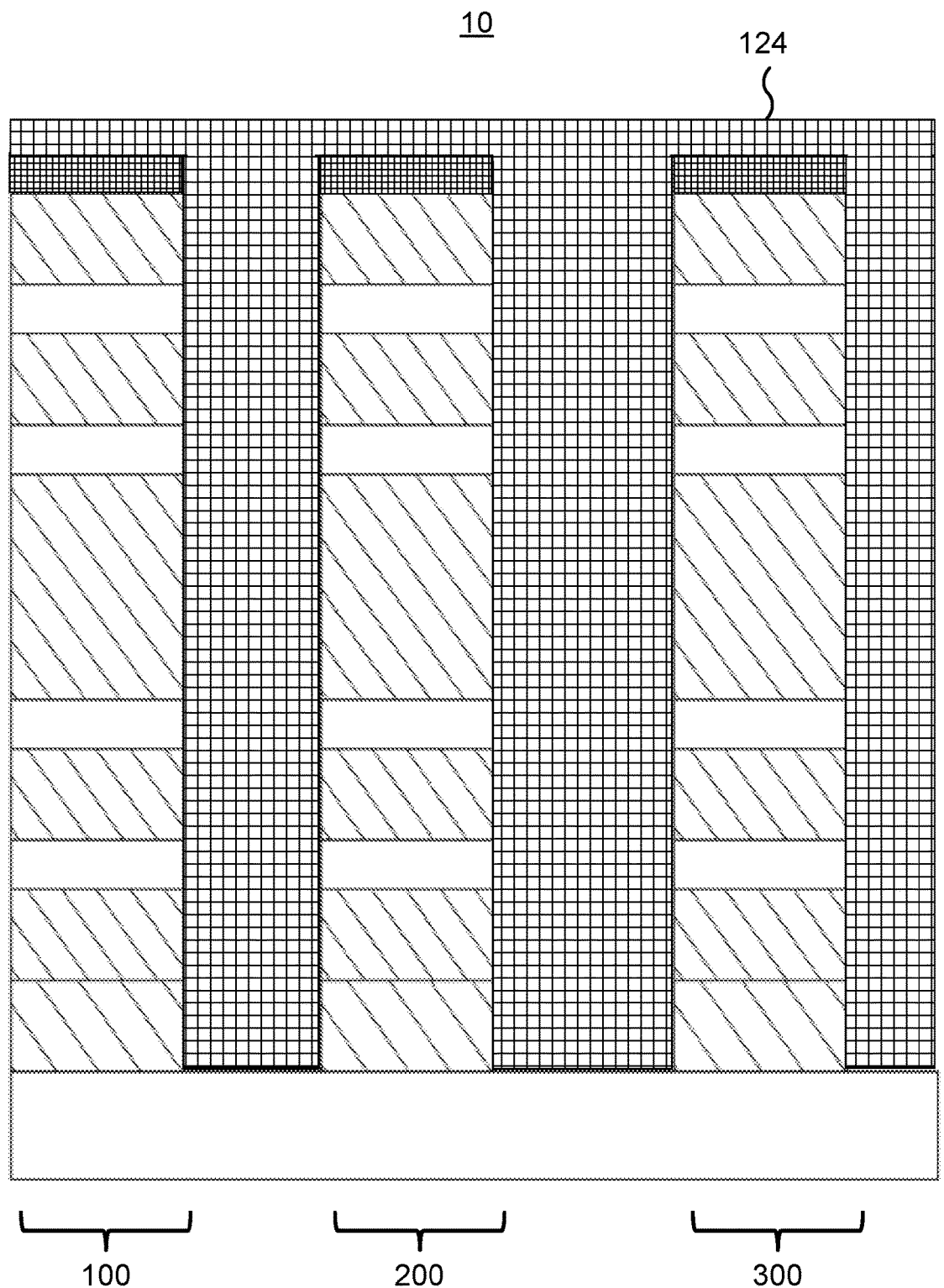
FIG. 1L shows a cross-section through the FET device at a twelfth point during the first fabrication method, according one implementation.
Figure 2:
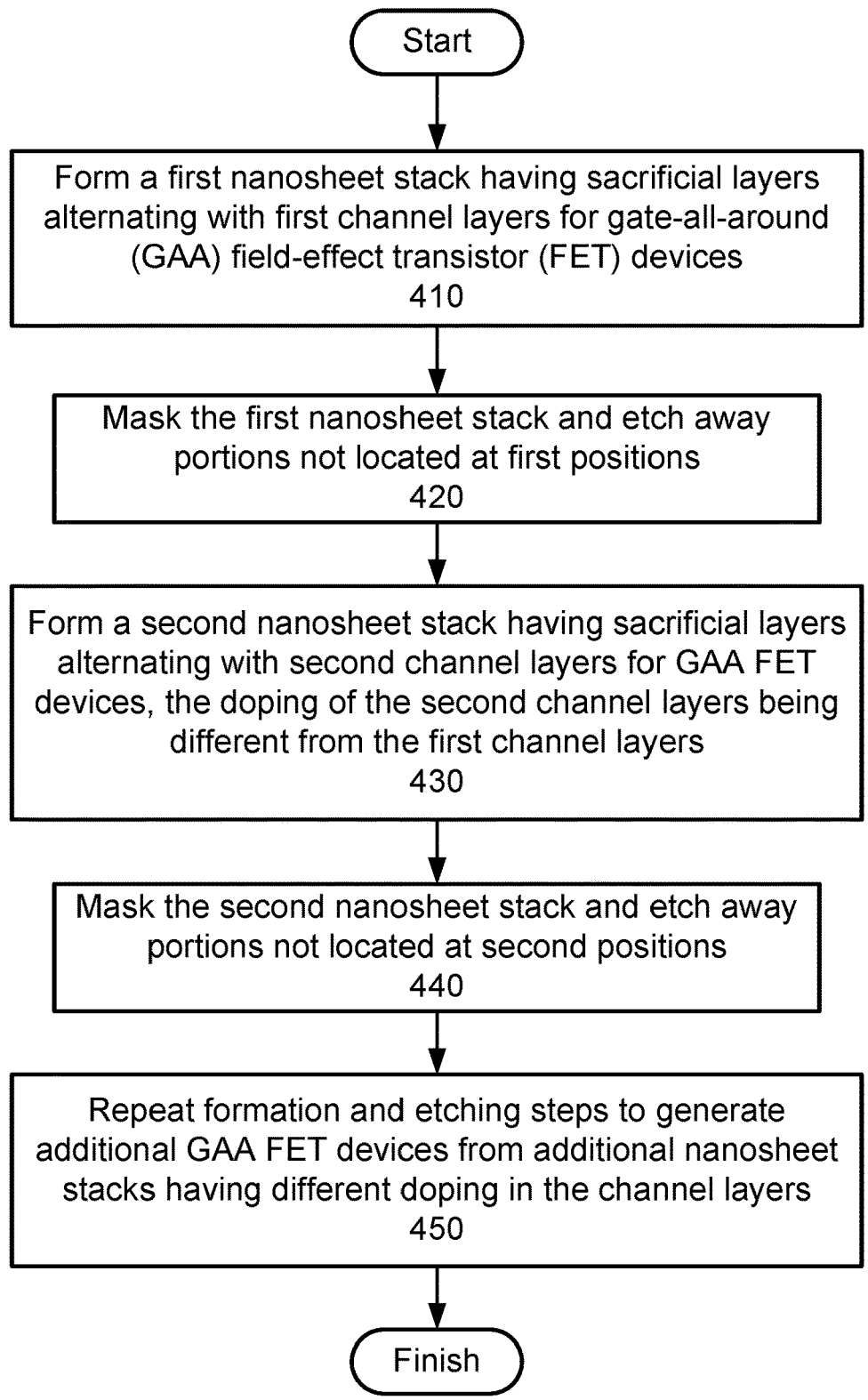
FIG. 2 shows a flow diagram of a first fabrication method for fabricating the FET device, according one implementation.

In step 450, additional nanosheet stacks are grown and etched, similar to the first and second nanosheet stacks. For example, FIG. 1J shows a third nanosheet stack being formed, and FIG. 1K shows the third nanosheet stack being masked and etched. Prior to growing the third nanosheet, the photoresist etch mask can be removed, leaving the conformal oxide film 124 covering the first and second nanosheet stack. The third nanosheet stack is formed by growing an etch stop layer 312, and then growing sacrificial layers 314 that alternate with first channel layers 316A and 316B and second channel layers 318A and 318B, with an oxide cap 320 on top. Similar to the channel layers for the first and second nanosheet stacks, the first channel layers 316A and 316B and the second channel layers 318A and 318B can have different doping characteristic and different geometry than the other channel layers in order to provide transistors with different properties. After the third nanosheet stack is grown, a silicon dioxide cap 320 can be deposited, and a photoresist etch mask 322 can be used to etch the third nanosheet stack 300 to the desired dimensions and locations on the surface of the substrate 110. FIG. 1L shows a cross-section of the resultant device in which the protective layer 124 is a further provided over the first nanosheet stack 100, the second nanosheet stack 200, and the third nanosheet stack 300.

Using method 400 each of the channel layers in the respective nanosheet stacks can have different doping to provide respective transistors with different threshold voltages, current handling, capacitance, $I_{Dsat}$, mobility, off state leakage, and transconductance.

FIGS. 3A-3L and 4 illustrates a second method 500 for fabricating GAA transistor devices having different channel characteristics. In contrast to method 400, method 500 uses a layer 120 to restrict the regions in which the respective nanosheet stacks can grow, whereas method 400 grow the nanosheet stacks over the entire wafer substrate and then etches the nanosheet stacks to remove it from locations where the nanosheet stacks is not wanted. Nevertheless, the result of method 500 is similar to the result of method 400.

Figure 3A:
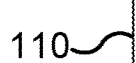
FIG. 3A shows a cross-section through a channel region of a field effect transitory (FET) device at a first point during a second fabrication method, according one implementation.

Like method 400, method 500 begins with an exposed substrate 110, as shown in FIG. 3A.

Figure 3B:
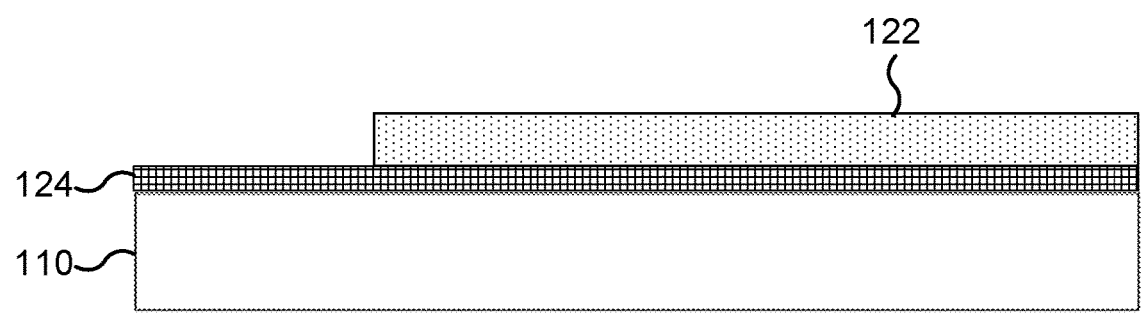
FIG. 3B shows a cross-section through the FET device at a second point during the second fabrication method, according one implementation.
Figure 3C:
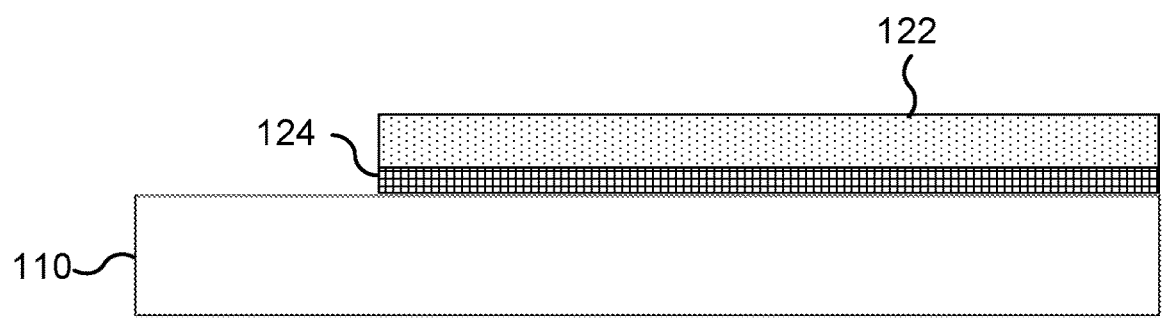
FIG. 3C shows a cross-section through the FET device at a third point during the second fabrication method, according one implementation.

In step 510 of method 500, an conformal oxide layer 124 is formed on the substrate 110, and then a mask 122 is applied on the conformal oxide layer 124. The etch mask 122 can be formed using self-aligned multi-patterning. The patterned mask 122 over the oxide layer 120 is shown in FIG. 3B. FIG. 3C shows that device after the conformal oxide layer 124 has been etched. Then, the etch mask 122 is removed. The residue of the oxide layer 124 prevents the first nanosheet stack 100 from forming, such that the first nanosheet stack 100 in the regions in which the substrate 110 is exposed.

Figure 3D:
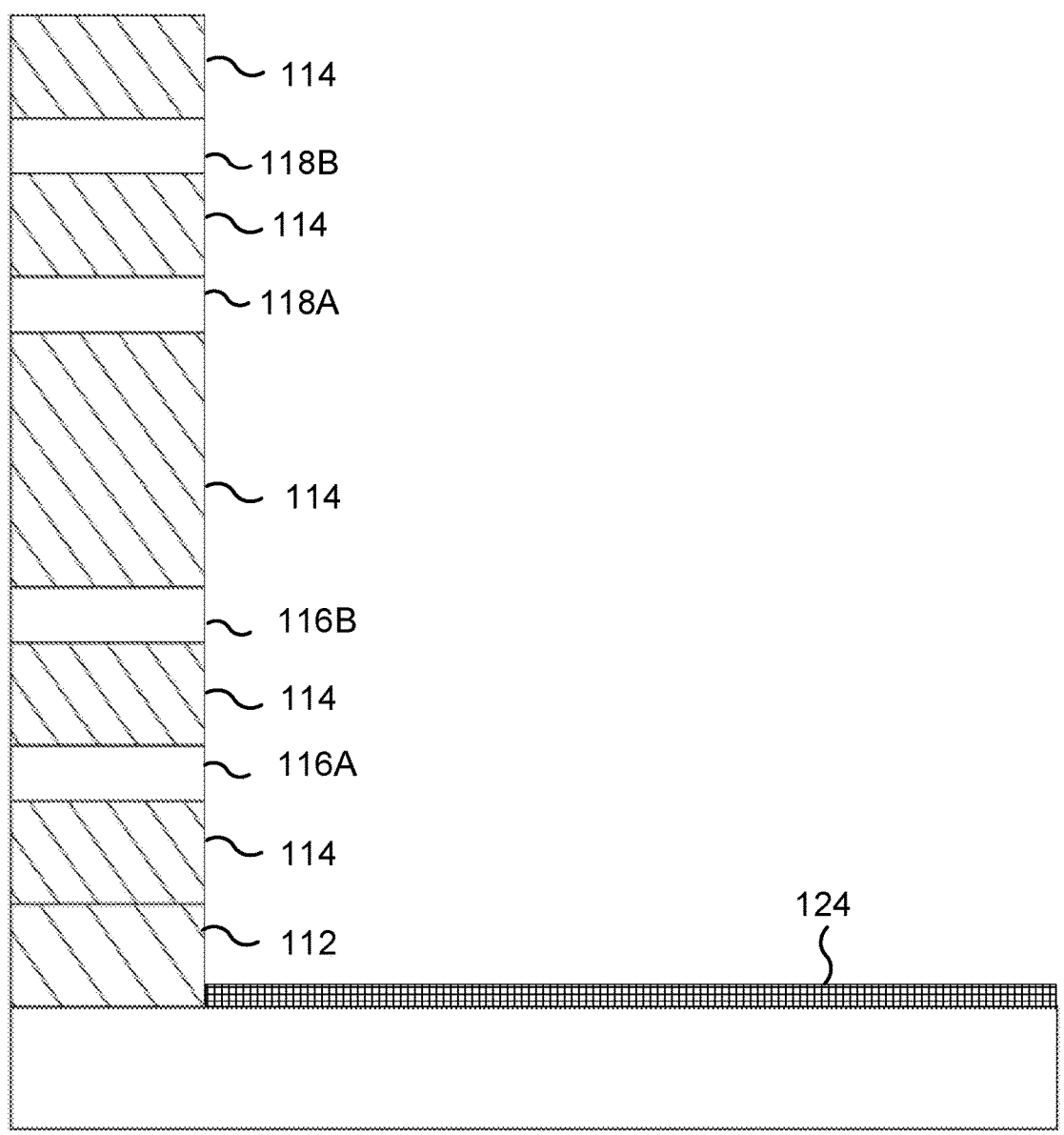
FIG. 3D shows a cross-section through the FET device at a fourth point during the second fabrication method, according one implementation.
Figure 3E:
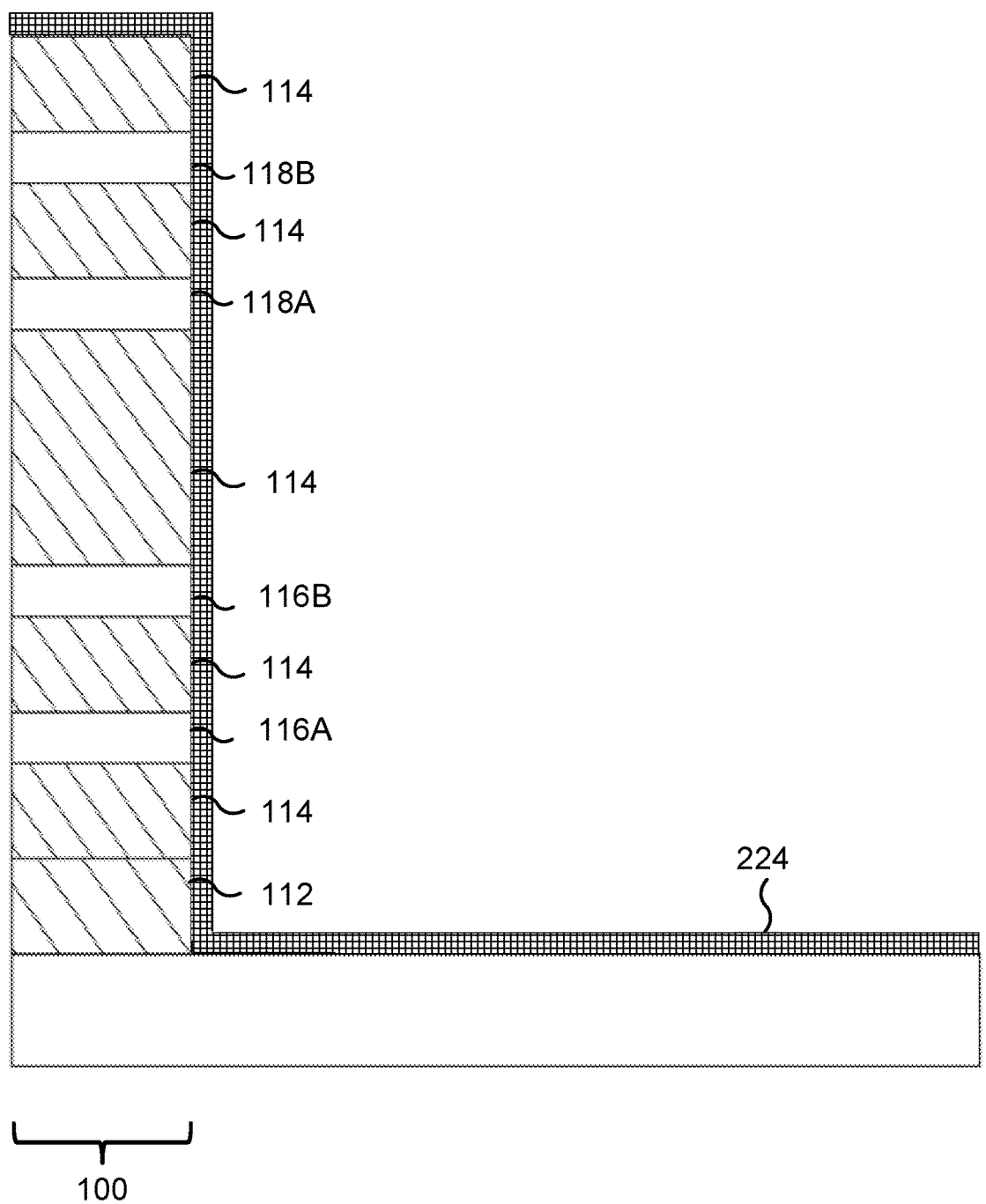
FIG. 3E shows a cross-section through the FET device at a fifth point during the second fabrication method, according one implementation.
Figure 3F:
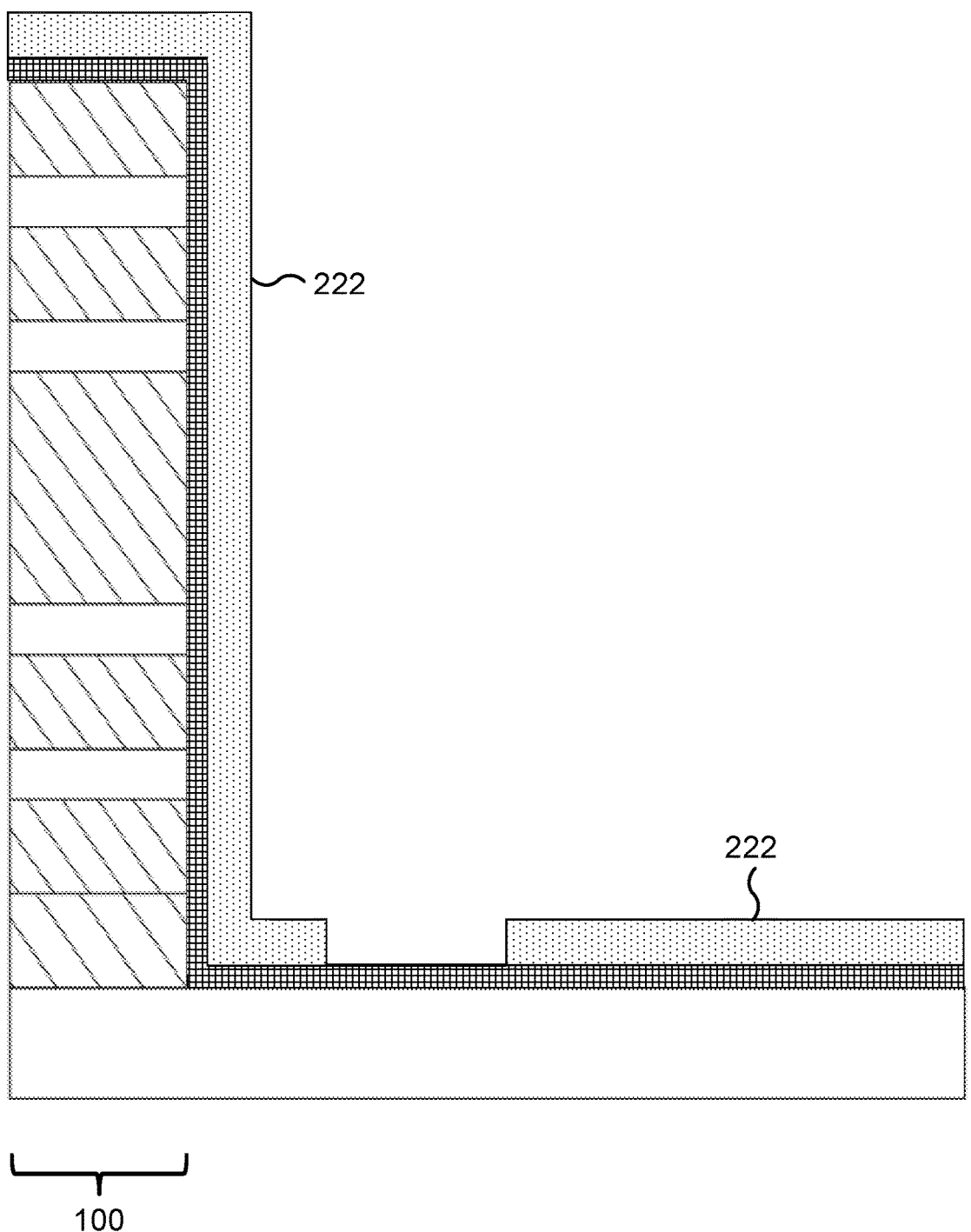
FIG. 3F shows a cross-section through the FET device at a sixth point during the second fabrication method, according one implementation.

In step 520, the first nanosheet stack 100 is formed on the exposed portion of the substrate 110, as shown in FIG. 3D. First, an etch stop layer 112 is grown, deposited, or otherwise formed on the substrate 110. In one non-limiting example, SiGe3 or Ge is used as the etch stop layer 112.

After forming the etch stop layer 112, multiple layers or thin films are then epitaxially grown, as shown in FIG. 3D. These layers include sacrificial layers 114 (e.g., SiGe2) alternating respectively with first channel layers 116A and 116B and second channel layers 118A and 118B.

Figure 3G:
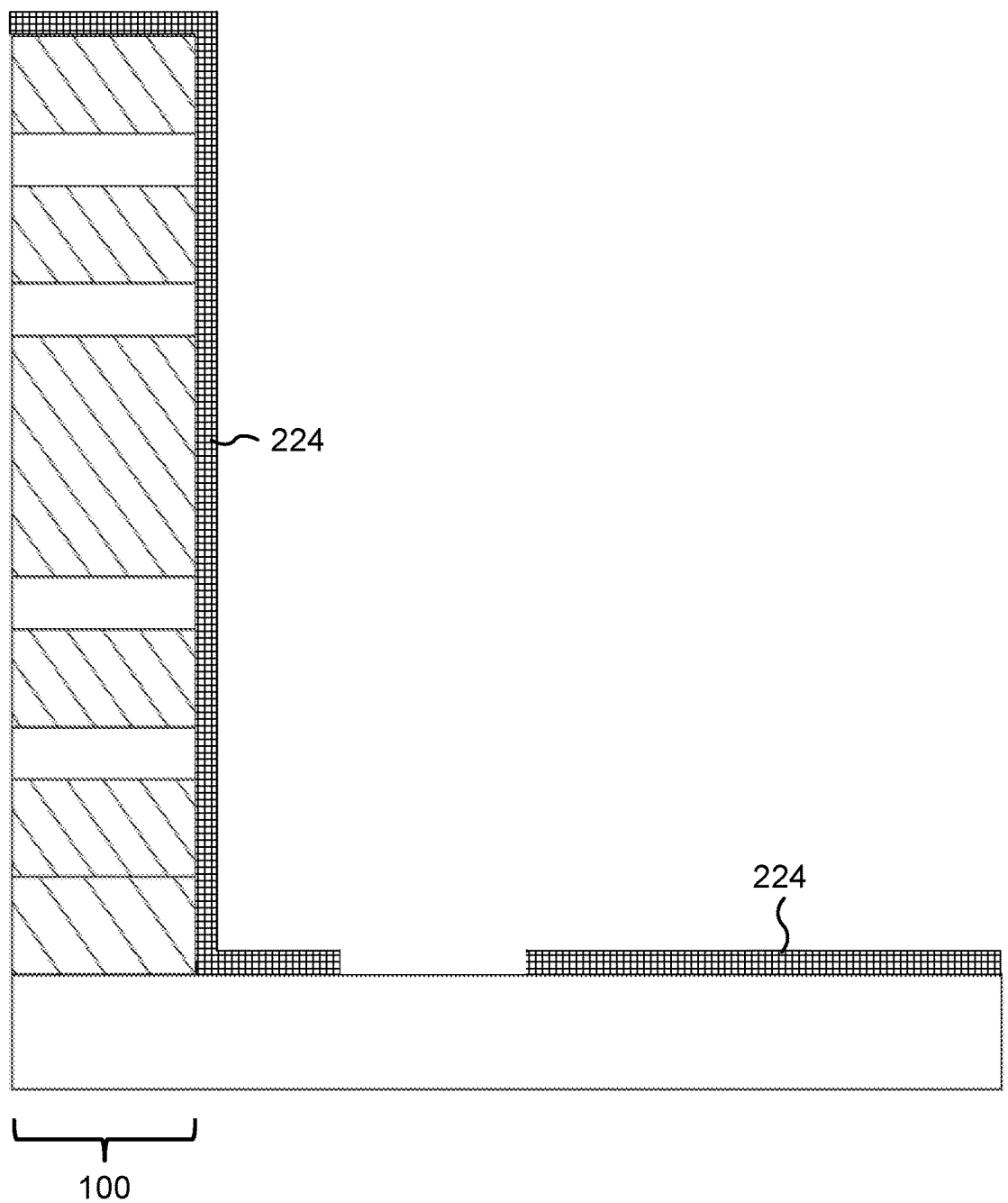
FIG. 3G shows a cross-section through the FET device at a seventh point during the second fabrication method, according one implementation.

In step 530, a conformal oxide layer 224 is grown of the first nanosheet stack 100 to prevent additional growth, and a mask 222 is applied on the conformal oxide layer 224. The etch mask 222 can be formed using self-aligned multi-patterning. The patterned mask over the oxide cap layer 120 is shown in FIG. 3B. FIG. 3C shows that device after the oxide cap layer 120 has been etched. Then, the etch mask 222 is removed, as shown in FIG. 3G.

Figure 3H:
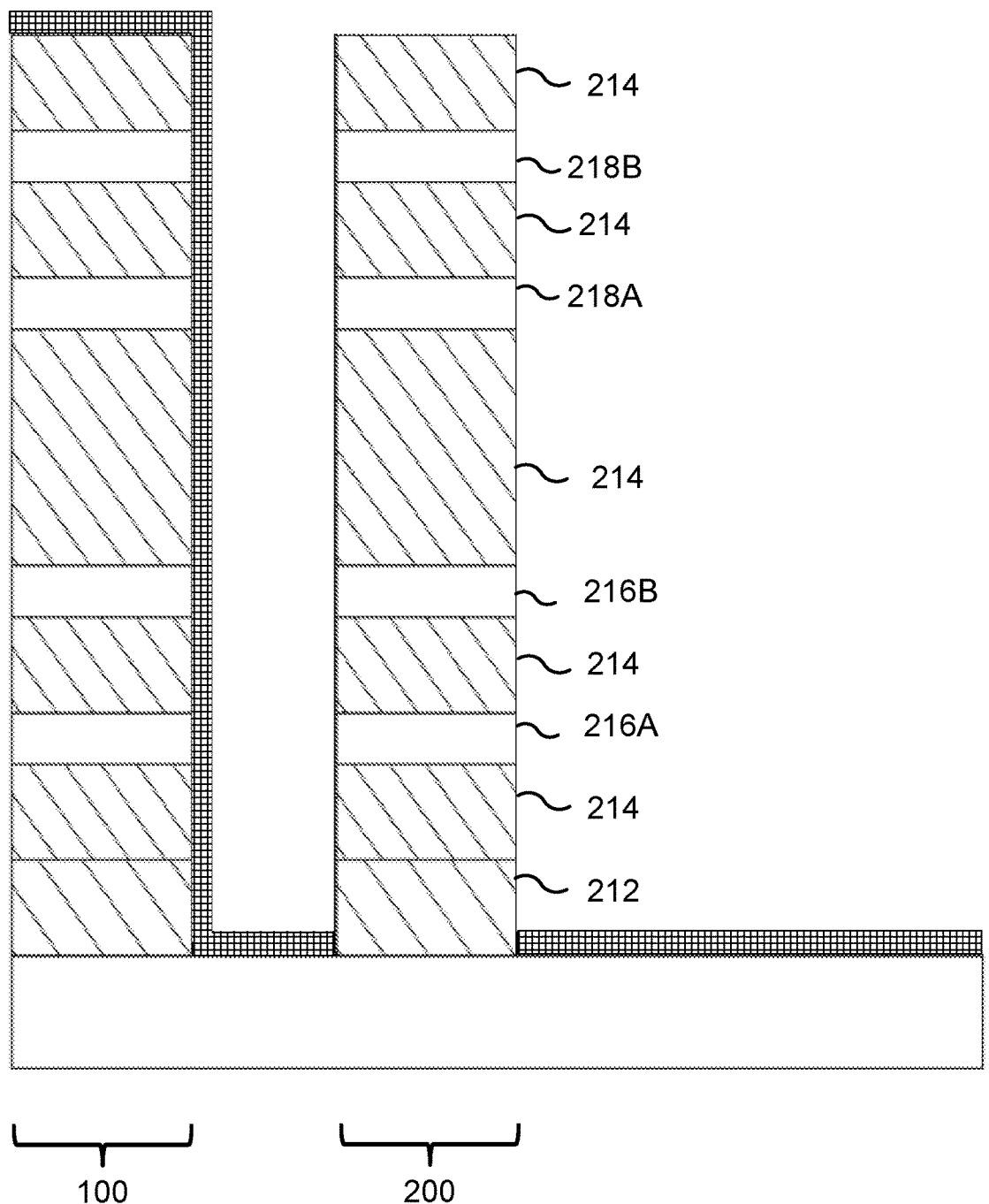
FIG. 3H shows a cross-section through the FET device at an eighth point during the second fabrication method, according one implementation.

In step 540, the second nanosheet stack 200 is formed on the exposed portion of the substrate 110, as shown in FIG. 3H. First, an etch stop layer 212 is grown, deposited, or otherwise formed on the substrate 110.

Figure 3I:
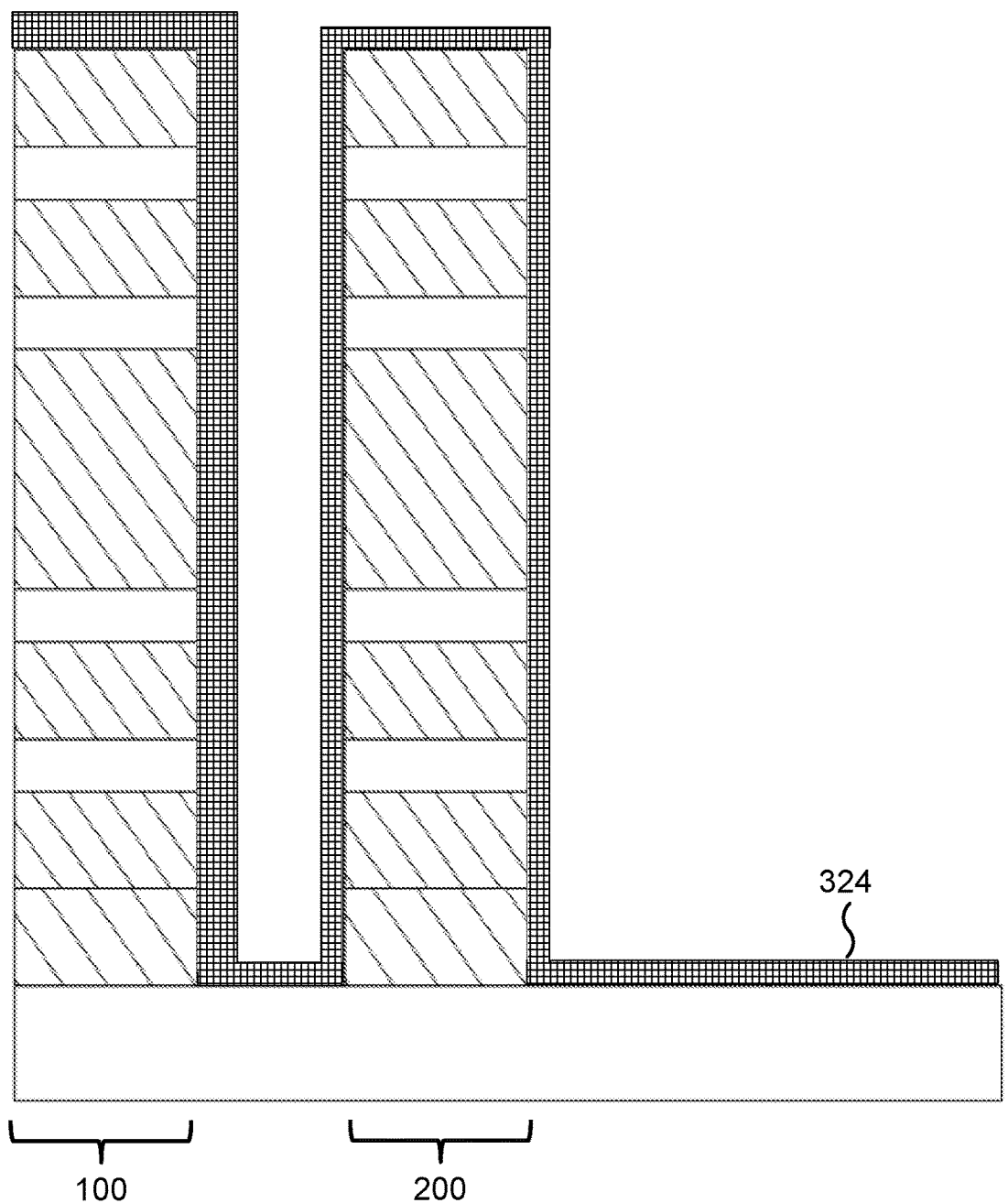
FIG. 3I shows a cross-section through the FET device at a ninth point during the second fabrication method, according one implementation.

After forming the etch stop layer 212, multiple layers or thin films are then epitaxially grown, as shown in FIG. 3H. These layers include sacrificial layers 214 (e.g., SiGe2) alternating respectively with first channel layers 216A and 216B and second channel layers 218A and 218B. FIG. 3I shows a conformal oxide layer 324 being grown over the first nanosheet stack 100 and the second nanosheet stack 200 to prevent additional layers growing.

Figure 3J:
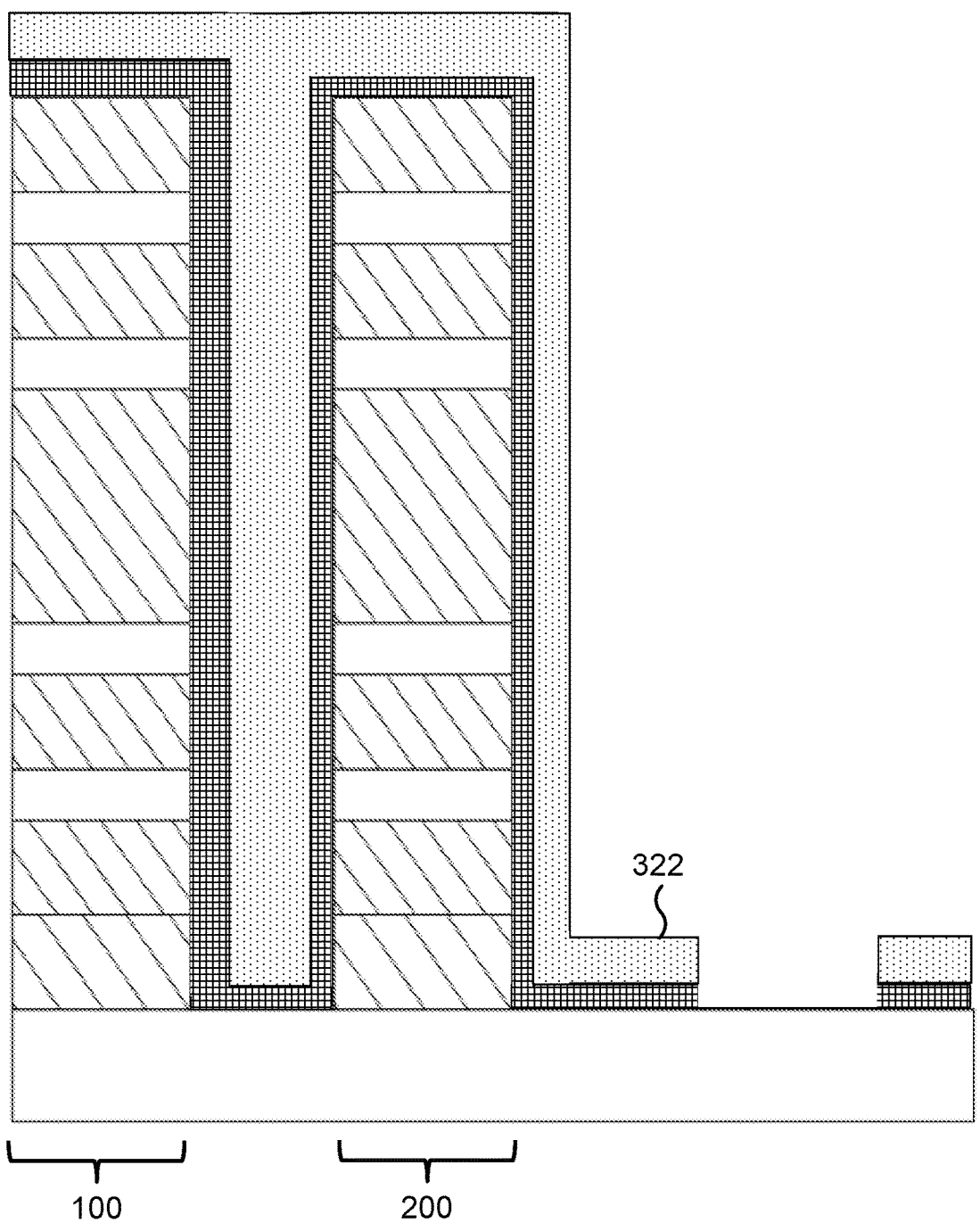
FIG. 3J shows a cross-section through the FET device at a tenth point during the second fabrication method, according one implementation.
Figure 3K:
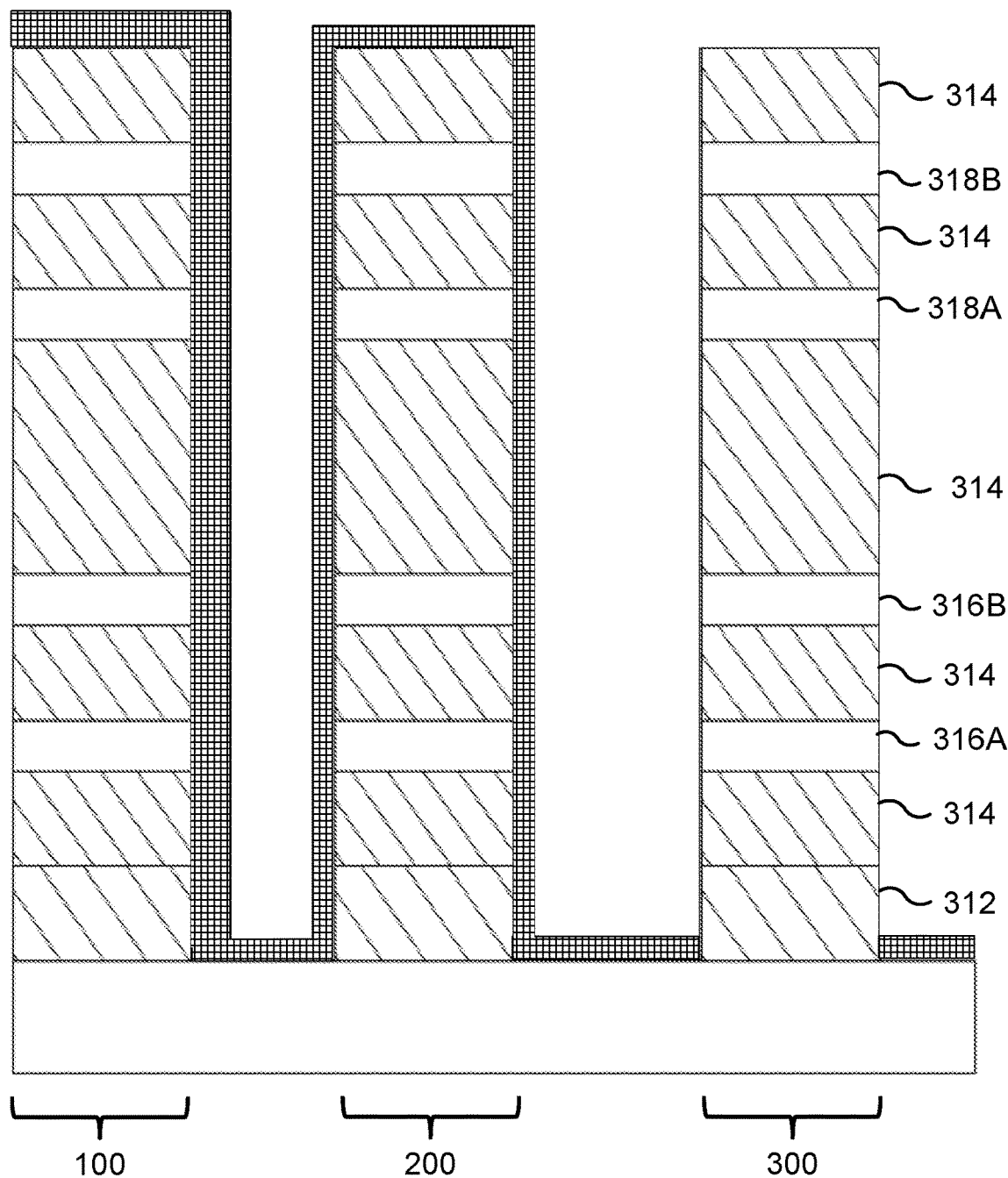
FIG. 3K shows a cross-section through the FET device at a eleventh point during the second fabrication method, according one implementation.
Figure 3L:
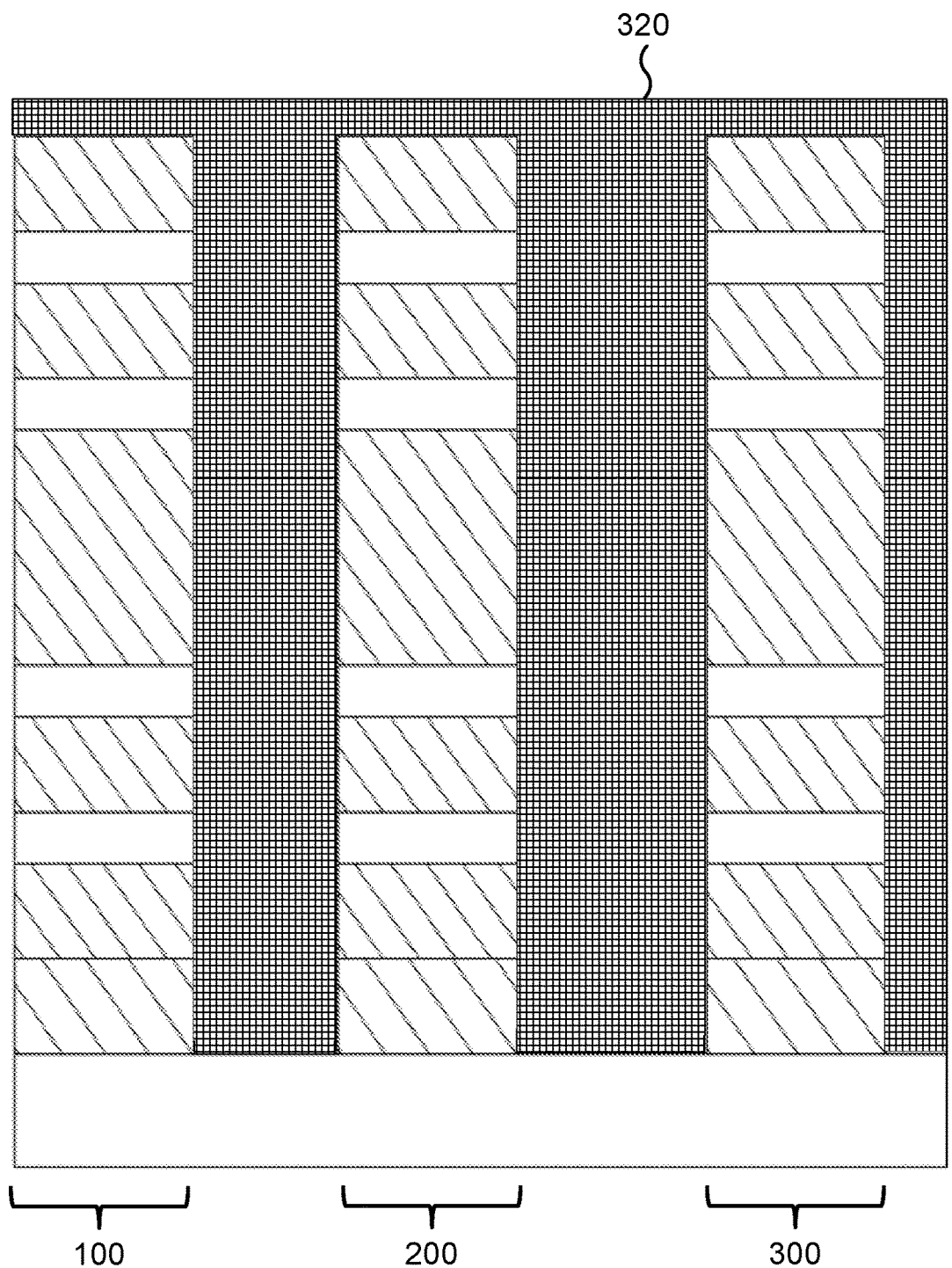
FIG. 3L shows a cross-section through the FET device at a twelfth point during the second fabrication method, according one implementation.

In step 550, additional nanosheet stack are grown in a similar manner to the first nanosheet stack 100 and the second nanosheet stack 200 described above. FIG. 3J shows the cross-section of the transistor device 10 after a etch mask 322 has been provided over the conformal oxide layer 324 to etch the conformal oxide layer 324 and expose a portion of the substrate 110 on which a third nanosheet stack 300 is to be grown. FIG. 3K shows that the nanosheet stack 300 has an etch stop layer 312 on the bottom, followed by sacrificial layers 314 (e.g., SiGe2) alternating respectively with first channel layers 316A and 316B and second channel layers 318A and 318B. as with the first nanosheet stack 100 and the second nanosheet stack 200, these layers of the third nanosheet stack 300 can be epitaxially grown to obtain a single crystal structure FIG. 3L shows that a result of method 500 is three distinct nanosheet stacks in which each nanosheet stack can have channel characteristics different from the other nanosheet stacks. In FIG. 3L, the protective oxide layer 320 (also referred to as an oxide cap layer) is grown around the nanosheet stacks, providing protection. The the oxide layer 320 can then be planarized, such as by using a CMP (chemical-mechanical polishing process). In certain implementations, the CMP process can stop when the uppermost sacrificial layers 114, 214, and 314 begin to be exposed by the CMP process, and then another deposition of oxide 320 can be performed to result in a planar oxide film above the substrate 110.

Note that channel material layers, which in this example are silicon layers, receive different dopants and/or different dopant amounts/concentrations. Accordingly each of the nanosheet stacks can have a different doping profile and thus different threshold voltages.

Thus, the techniques described herein provide devices and processes to fabricate transistors with multiple different threshold voltages. Nanosheet stacks can be grown with different doping so that various GAA field-effect transistor (FET) devices in a chip can have different threshold voltages.

Additional processing steps for microfabrication of 3D FET devices can be executed before or after formation of nanosheets with different doping profiles. Additional processes can include forming buried power rail, shallow trench isolation (STI) active refill, CMP, etching to reveal nanosheets, dummy gate patterning with poly silicon, selective SiGe release, deposit low-K gate and etch low-k gate, spacer formation. Accordingly, gates can be formed for FETs of different voltage thresholds thereby providing high voltage and low voltage FETs side-by-side each other. In other embodiments, nanosheet stacks can be formed with one doping profile, or without any doping. Channels are then doped after the formation of source/drain regions.

Figure 5:
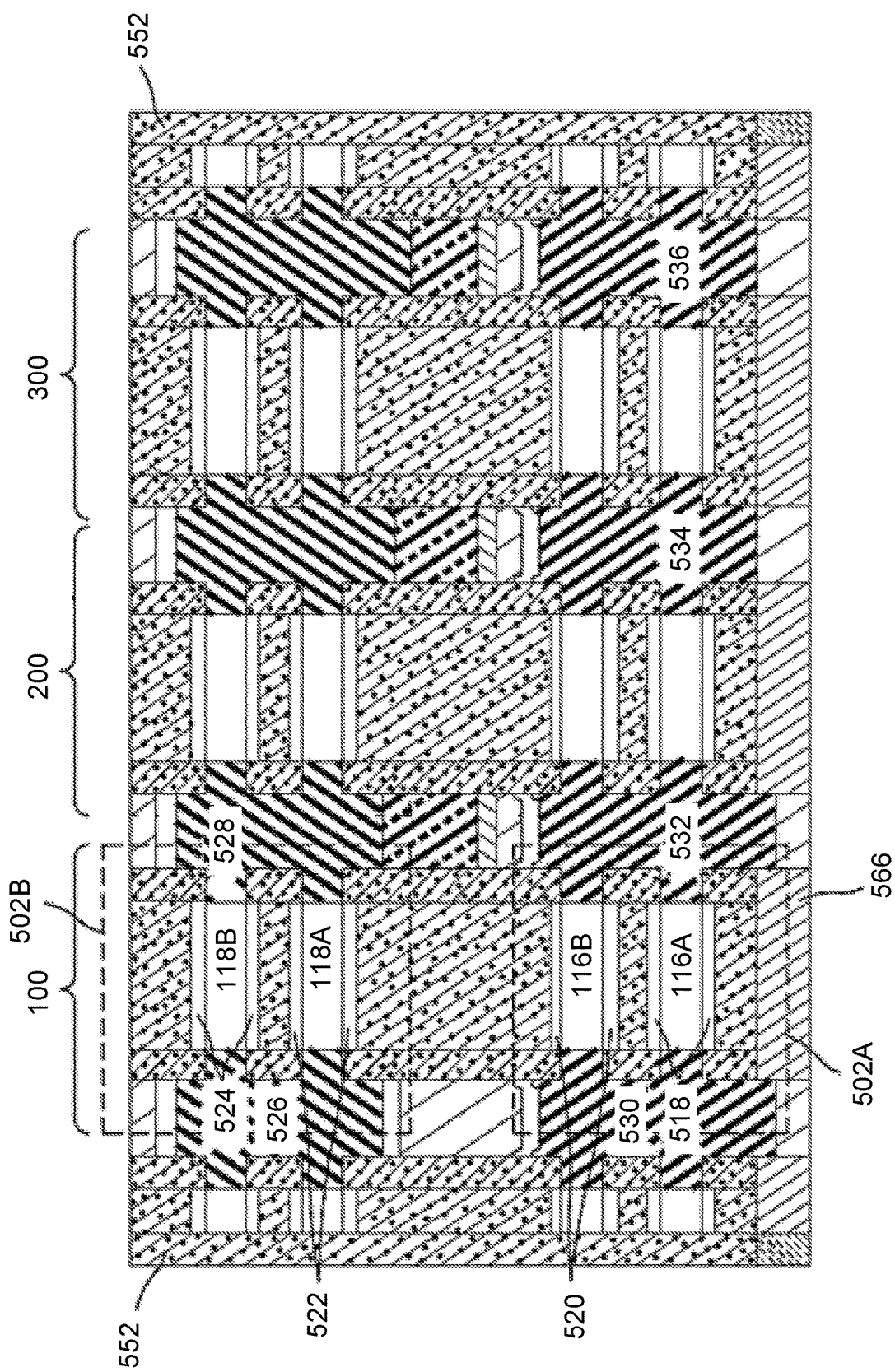
FIG. 5 shows a cross-section through the FET device after fabricating source/drain (S/D) regions and other aspects of the FET device, according one implementation.

FIG. 5 illustrates a cross-sectional view of a GAA FET device that has different characteristics in channel regions. As shown in FIG. 5, a GAA FET device 10 is provided. The GAA FET device 10 can include a plurality of transistor pairs formed over a substrate (not shown). For example, the three nanosheet stacks 100, 200, and 300 can be included in the device 10. Each of the nanosheet stacks can include a transistor pair including a first transistor (e.g., the transistor 502A using a combination of the first channel layers 116A and 116B) and a second transistor (e.g., the transistor 502B using a combination of the second channel layers 118A and 118B). For example, a transistor pair can include a n-type transistor and a p-type transistor that are stacked over one another. In some embodiments, the n-type transistor is positioned over the p-type transistor. In some embodiment, the p-type transistor is positioned over the n-type transistor. In some embodiments, both transistors in a transistor pair are p-type transistors. In another embodiment, both transistors in a transistor pair are n-type transistors.

In an embodiment of FIG. 5, in the transistor pair of the first stack 100, transistor 502A is a first transistor of the pair, and transistor 502B is a second transistor of the pair.

Transistor 502A is discussed herein as illustrative of the transistors in the device 10. Here, a case in which transistor 502A is an n-type transistor is used as one non-limiting example. Transistor 502A has a first source/drain (S/D) region and a second S/D region that are positioned at two ends of the first channel layers 116A and 116B and are in direct contact with the first channel layers 116A and 116B. In some embodiments, the first and second S/D regions of the n-type transistor can be made of silicon doped with phosphorous.

Here, a case in which transistor 502B is a p-type transistor is used as one non-limiting example. The p-type transistor can include a first S/D region and a second S/D region that are positioned at two ends of the second channel layers 118A and 118B and in direct contact with the second channel layers 118A and 118B. In some embodiments, the first S/D region and the second S/D region of the p-type transistor can be made of silicon doped with boron. For example, as shown in FIG. 5, the n-type transistor 502A can have a first S/D region 126 and a second S/D region 128, which are positioned at two ends of the first channel layers 116A and 116B, and in direct contact with the first channel layers 116A and 116B. The p-type transistor 502B has a first S/D region 530 and a second S/D region 532, which are positioned at two ends of the second channel layers 118A and 118B, and in direction contact with the second channel layers 118A and 118B.

The n-type transistor and the p-type transistor can also have a gate structure respectively. The gate structure can be formed to surround the channel regions. For example, the transistor 502A can have gate structures 518 and 520 that surround the first channel layers 116A and 116B, respectively. The transistor 502B can have gate structures 522 and 524 that surround the second channel layers 118A and 118B, respectively.

In the disclosed device 10, the plurality of transistor pairs can be formed side by side, and coupled to each other. For example, the transistor pair in stack 100 is illustrated being coupled to the transistor pair in stack 200, where the second S/D region 528 of the transistor 502B in the transistor pair in stack 100 can function as a first S/D region of a second transistor in stack 200, which corresponds to the second channel layers 218A and 218B. Similarly, the second S/D region 532 of the transistor 502A in the can function as a first S/D region of the first transistor in stack 200.

Figure 6:
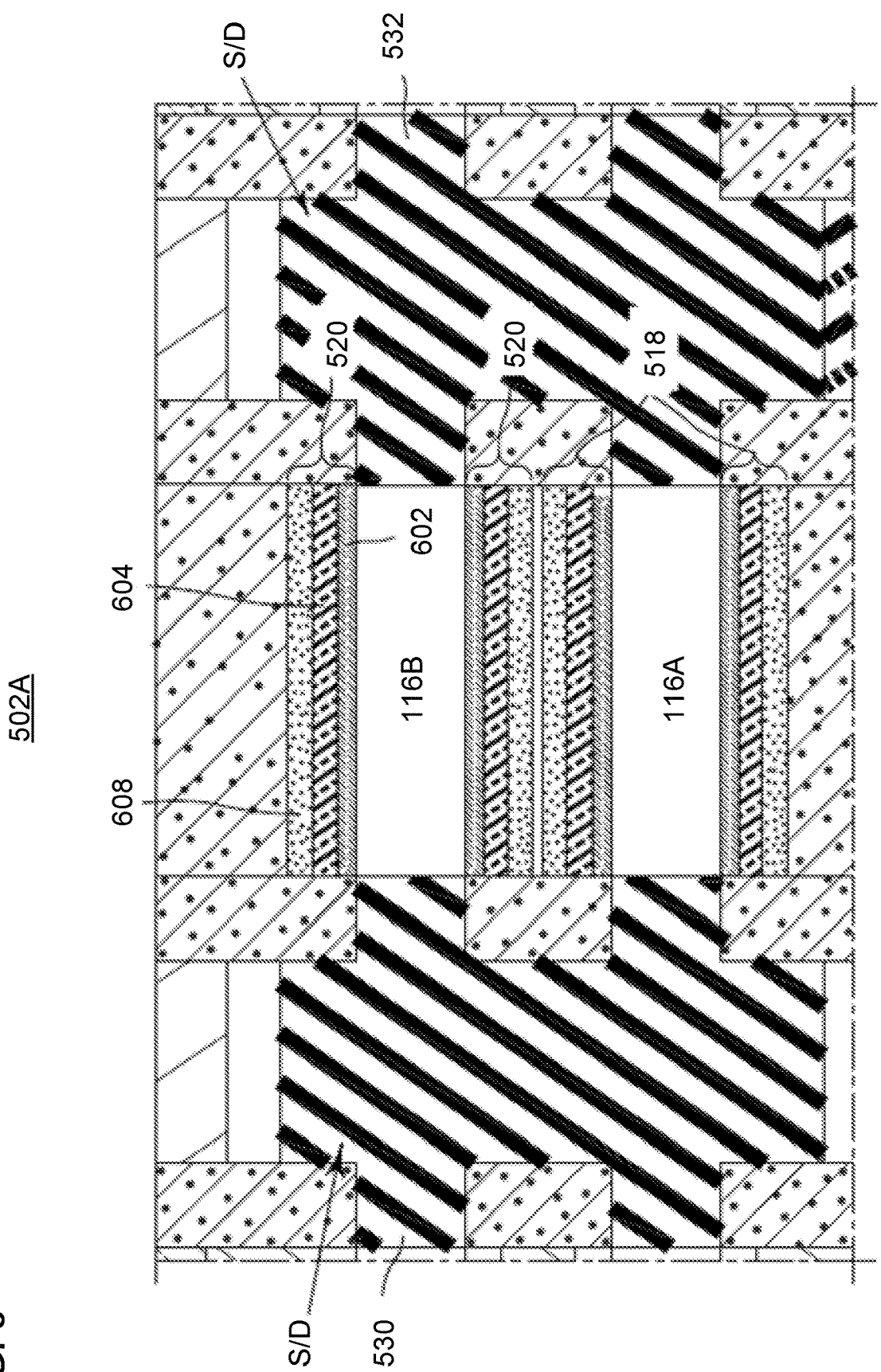
FIG. 6 shows a cross-section of one of the transistors of the FET device shown in FIG. 5, according one implementation.

FIG. 6 is an expanded view of the gate structure of the transistor 502A. As shown in FIG. 6, the channel region of transistor 502A can include the two first channel layers 116A and 116B. Each of the first channel layers can have a respective gate structure that surrounds the channel layers. For example, the first channel layer 116A can have a surrounded gate structure 518 and the first channel layer 116B can have a surrounded gate structure 520. The gate structure 518 can include a first dielectric layer 602 that surrounds the first channel layer 116A and in direct contact with the first channel layer 116A. The gate structure 518 can have a second dielectric layer 604 that is formed over the first dielectric layer 602. The gate structure 518 can also have a metal gate stack 608 positioned over the second dielectric layer 604. In some embodiments, the first dielectric layer 602 can be an interfacial oxide layer, such as $SiO_2$. The second dielectric layer 604 can be a high-k layer, such as $HfO_2$, and the metal gate stack 608 can include a TiC layer positioned over the second dielectric layer 604.

Similarly the transistor 502B can be a p-type transistor. The channel region of the p-type transistor 502B can include the two second channel layers 118A and 118B. Each of the second channel layers can have a respective gate structure that surrounds the second channel layers. For example, the second channel layer 118A can have a surrounded gate structure 522, and the second channel layer 118B can have a surrounded gate structure 524. The gate structure 522 can include a first dielectric layer (e.g., an interfacial oxide layer, such as $SiO_2$) that surrounds the second channel layer 118A and in direct contact with the second channel layer 118A. The gate structure 522 can have a second dielectric layer (e.g., a high-k layer, such as $HfO_2$, $Al2O_3$, $Y_2O_3$, $ZrO_2$, etc.) that is formed over the first dielectric layer. The gate structure 522 can also have a metal gate stack positioned over the second dielectric layer. The metal gate stack can include a TiC layer positioned over the second dielectric layer, a TaN layer positioned over the TiN layer, a TiON layer positioned over the TaN layer, and a TiC layer positioned over the TaN layer. An oxide layer 552 can be formed when the formation of the bottom and top source/drain (S/D) regions are complete.

FIGS. 5 and 6 are non-limiting examples of the gate structures in the device 10. The gate structures can further include gate electrodes. The gate electrodes can include a TiN liner formed over the metal gate stack, and a conductive layer (e.g., tungsten, cobalt) formed over the TiN liner. In addition, the gate structures can include less or more layers than the layers illustrated in FIGS. 5 and 6.

Source/drain (S/D) regions are formed by masking the substrate 110 leaving a lower source/drain area uncovered for growing a doped source/drain (either n-type or p-type). A lower plane of source/drain regions can then be covered and an upper plane can be selectively uncovered for growing a given type of source/drain region. Additional steps to complete FET devices can include forming local interconnects, removing dummy gate material and replacing with metal gates and one or more gate oxides, followed by additional metallization.

Another embodiment includes plasma-based doping executed prior to a first oxide deposition of the gate oxide followed by a cleaning step. For plasma doping, a mask is used to uncover selected channels to receive the doping. At this point channels have been formed from bulk nanosheet stacks. This embodiment is more efficient by having an NMOS S/D region on top of another NMOS S/D region for process simplification or vice-versa for PMOS and tunneling FET (TFET), i.e., same type of FET stack. Plasma doping may be applied to any transistor type. In certain implementations, an anneal can be performed after plasma doping is completed. Then the Gate oxide process is continued.

Accordingly, techniques herein provide more $I_{Dsat}$ (drive current saturation) that is available per area of chip layout. Multiple threshold voltages ($V_t$s) can be provided for low voltage and high voltage areas with multiple gate oxide thickness for both low-voltage and high-voltage. Voltage threshold is affected by different doping profiles of channels as well as gate oxide thickness and high-K materials. Generally, increasing a thickness of a gate oxide increases a $V_t$ of the corresponding transistor. Low-voltage devices can function with a lower drain-source voltage ($V_{ds}$) of less than 1V or approximately 1V, while high-voltage devices typically operate at greater than approximately 5V. Also, gate voltage is larger in high-voltage devices compared to low-voltage devices. High-voltage regions can have a larger voltage of the drain side of the transistor. For example, this drain side voltage can be 5V to 10V, while low-voltage can have approximately 1.0V. Thus, the gate oxide is preferably robust and reliable, which can be achieve using a thicker gate oxide. Many circuit designs use multiple different low-voltage and high-voltage devices, with different $V_t$ values for each with increments of 0.3V, though this can vary greatly depending on a transistor. For example, a low-voltage device may have 3 low $V_t$ values of 0.3V, 0.6V, 0.9V. By using both gate oxide thickness and/or channel doping, these $V_t$ values can be obtained. Additionally, using both gate oxide thickness and/or channel doping other $V_t$ values can be obtained. Also, techniques herein include any combination of $V_{ds}$ and Vt values possible that would be specified for different circuit applications.

New transistor architectures herein enable 1 to 10 or more planes of transistors depending on circuit requirements. Tunneling field-effect transistors can be co-integrated with emerging complementary FET (CFET) transistor device without additional process steps. The tunneling transistor can be used for future scaling for low power and channel length scaling. Techniques herein provide a cost-effective dual gate process for CFET fabrication. Both p-channel and n-channel devices can be fabricated in a same epi stack with selective source/drains. Transistor channels can also be doped after nanosheet stack formation and after S/D doping as an option with one mask and one plasma implant.

Both high voltage and low voltage devices, with multiple $V_t$ and gate oxide thickness are herein disclosed for 3D memory circuits with 3D logic circuits and for many other circuits designs.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate 110 may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate 110 is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of microfabrication, the method comprising:
forming a first nanosheet stack on a substrate, the first nanosheet stack having first layers of material including a semiconducting material, at least two of the first layers being first channels of gate-all-around (GAA) field-effect transistor (FET) devices, the first channels comprising a first channel material having a first doping profile;
masking a portion of the first nanosheet stack;
etching unmasked portions of the first nanosheet stack down to a predetermined depth; and
growing a second nanosheet stack on the substrate in regions of the substrate that have been etched, the second nanosheet stack being in plane with the first nanosheet stack, the second nanosheet stack having second layers of material including the semiconducting material, at least two of the second layers of material being second channels of GAA FET devices, the second channels comprising a second channel material having a second doping profile, the second doping profile causing the GAA FET devices of the second channels to have a different threshold voltage than the GAA FET devices of the first channels, wherein the step of forming the first nanosheet stack further includes that the first channels include at least four channels in which pairs of channels share common source/drain regions, such that one pair of channels forms a single GAA FET.

2. A method of microfabrication, the method comprising:
forming a first nanosheet stack on a substrate, the first nanosheet stack having first layers of material including a semiconducting material, at least two of the first layers being first channels of gate-all-around (GAA) field-effect transistor (FET) devices, the first channels comprising a first channel material having a first doping profile;
masking a portion of the first nanosheet stack;
etching unmasked portions of the first nanosheet stack down to a predetermined depth; and
growing a second nanosheet stack on the substrate in regions of the substrate that have been etched, the second nanosheet stack being in plane with the first nanosheet stack, the second nanosheet stack having second layers of material including the semiconducting material, at least two of the second layers of material being second channels of GAA FET devices, the second channels comprising a second channel material having a second doping profile, the second doping profile causing the GAA FET devices of the second channels to have a different threshold voltage than the GAA FET devices of the first channels,
wherein the step of growing the second nanosheet stack further includes that second channels have a channel dimension that is different than the first channels further causing the GAA FET devices of the second channels to have a different operating characteristic than the GAA FET devices of the first channels, the different operating characteristic being one of a capacitance, a current, a current-voltage curve, drive current saturation, mobility, off state leakage, and transconductance.

3. The method of claim 1, wherein the first channels are doped using one of an n-type doping or a p-type doping and the second channels are doped using another of the n-type doping or the p-type doping, such that when the first channels have the p-type doping the second channels have the n-type doping and when the first channels have the n-type doping the second channels have the p-type doping.

4. The method of claim 1, further comprising, prior to growing the second nanosheet stack, forming a conformal layer over the first nanosheet stack and then masking and etching the conformal layer to define the regions of the substrate that have been etched and in which the second nanosheet stack is grown.

5. The method of claim 1, further comprising additional nanosheet stacks having additional channels comprising additional channel material, which have different doping profiles than the first channels and the second channels.

6. The method of claim 1, wherein, in the step of growing the second nanosheet stack, the second channels are grown level with the first channels.

7. The method of claim 1, further comprising creating GAA FET devices using the first channels and the second channels as GAA FET channels.

8. The method of claim 1, further comprising, prior masking the portion of the first nanosheet stack, forming a cap layer on the first nanosheet stack.

9. The method of claim 1, wherein the first nanosheet stack is epitaxially grown and the semiconducting material is silicon or is a III-V semiconductor.

10. The method of claim 1, wherein the first channels are doped using a different dopant concentration than the second channels.

11. The method of claim 1, wherein given layers of the first nanosheet stack are doped as individual layers are being grown.

12. A method of microfabrication, the method comprising:
forming a first mask on a substrate that defines a first region on the substrate, the first region being not covered by the first mask;
forming, in the first region, a first nanosheet stack on the substrate, the first nanosheet stack having first layers of material including a semiconducting material, at least two of the first layers being first channels of gate-all-around (GAA) field-effect transistor (FET) devices, the first channels comprising a first channel material having a first doping profile;

forming a second mask on the substrate that defines a second region on the substrate, the second mask covering the first nanosheet stack, and the second region being not covered by the second mask; and forming a second nanosheet stack on the substrate in the second region, the second nanosheet stack being in plane with the first nanosheet stack, the second nanosheet stack having second layers of material including the semiconducting material, at least two of the second layers being second channels of GAA FET devices, the second channels comprising a second channel material having a second doping profile, the second doping profile causing the GAA FET devices of the second channels to have having a different threshold voltage than the GAA FET devices of the first channels, wherein the step of forming a first nanosheet stack further includes that the first channels include at least four channels in which pairs of channels share common source/drain regions, such that one pair of channels forms a single GAA FET.

13. The method of claim 12, wherein the step of growing the second nanosheet stack further includes that second channels have a channel dimension that is different than the first channels further causing the GAA FET devices of the second channels to have a different operating characteristic than the GAA FET devices of the first channels, the operating characteristic being one of a capacitance, a current, and a current-voltage curve.

14. The method of claim 12, wherein, in the first channels are doped using one of an n-type doping or a p-type doping and the second channels are doped using another of the n-type doping or the p-type doping, such that when the first channels have the p-type doping the second channels have the n-type doping and when the first channels have the n-type doping the second channels have the p-type doping.

15. The method of claim 12, further comprising additional nanosheet stacks having additional channels comprising additional channel material, which have different doping profiles than the first channels and the second channels.

16. The method of claim 12, wherein the first nanosheet stack is epitaxially grown and the semiconducting material is silicon or is a III-V semiconductor.

17. The method of claim 12, further comprising creating GAA FET devices using the first channels and the second channels as GAA FET channels.

18. The method of claim 12, wherein given layers of the first nanosheet stack are doped as individual layers are being grown.

* * * * *

UNITED STATES PATENT AND TRADEMARK OFFICE
CERTIFICATE OF CORRECTION

| | |
|---|---|
| PATENT NO. | : 11,264,285 B2 |
| APPLICATION NO. | : 16/665599 |
| DATED | : March 1, 2022 |
| INVENTOR(S) | : Gardner et al. |

It is certified that error appears in the above-identified patent and that said Letters Patent is hereby corrected as shown below:

In the Claims

In Column 15, Claim 12, Line 14, delete "having".

Signed and Sealed this
Twelfth Day of July, 2022

*Katherine Kelly Vidal*

Katherine Kelly Vidal
*Director of the United States Patent and Trademark Office*